United States Patent
Hara et al.

(10) Patent No.: US 9,853,164 B2
(45) Date of Patent: Dec. 26, 2017

(54) SEMICONDUCTOR DEVICE AND DISPLAY DEVICE

(71) Applicant: Sharp Kabushiki Kaisha, Osaka (JP)

(72) Inventors: Takeshi Hara, Osaka (JP); Hirohiko Nishiki, Osaka (JP); Izumi Ishida, Osaka (JP); Shogo Murashige, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 25 days.

(21) Appl. No.: 14/432,997

(22) PCT Filed: Sep. 30, 2013

(86) PCT No.: PCT/JP2013/076509
§ 371 (c)(1),
(2) Date: Apr. 1, 2015

(87) PCT Pub. No.: WO2014/054569
PCT Pub. Date: Apr. 10, 2014

(65) Prior Publication Data
US 2015/0303307 A1     Oct. 22, 2015

(30) Foreign Application Priority Data
Oct. 3, 2012  (JP) .................... 2012-221240

(51) Int. Cl.
*G02F 1/136*   (2006.01)
*H01L 29/786*  (2006.01)
(Continued)

(52) U.S. Cl.
CPC ........ *H01L 29/7869* (2013.01); *G02F 1/1368* (2013.01); *G02F 1/136286* (2013.01);
(Continued)

(58) Field of Classification Search
CPC ............... H01L 29/7869; H01L 29/24; H01L 29/78606; H01L 27/1248; H01L 21/28008; G02F 1/1368; G02F 1/136286
(Continued)

(56) References Cited

U.S. PATENT DOCUMENTS 5,952,708 A      9/1999  Yamazaki
2003/0047785 A1  3/2003  Kawasaki et al.
(Continued)

FOREIGN PATENT DOCUMENTS

EP     2 657 974 A1   10/2013
JP     9-197390 A      7/1997
(Continued)

OTHER PUBLICATIONS

U.S. Appl. No. 14/431,683, filed Mar. 26, 2015 and U.S. Appl. No. 14/432,991, filed Apr. 1, 2015.

*Primary Examiner* — Charles Chang
(74) *Attorney, Agent, or Firm* — Chen Yoshimura LLP

(57) ABSTRACT

This semiconductor device is provided with: a semiconductor film that comprises an oxide semiconductor, and includes a channel region; a first inorganic insulating film formed on the semiconductor film; a first organic insulating film formed on the first inorganic insulating film; and an inorganic film group. The inorganic film group has: a first electrode comprising an inorganic conductive film formed on the first organic insulating film; a second inorganic insulating film formed on the first electrode; and a second electrode that comprises an inorganic conductive film formed on the second inorganic insulating film, and is electrically connected to the semiconductor film via openings formed in such a manner as to penetrate the first inorganic insulating film, the first organic insulating film, the first electrode and the second inorganic insulating film. The (Continued)

first organic insulating film is disposed between the first inorganic insulating film and the inorganic film group.

18 Claims, 14 Drawing Sheets

(51) Int. Cl.
  H01L 27/12      (2006.01)
  G02F 1/1362     (2006.01)
  G02F 1/1368     (2006.01)
  H01L 29/24      (2006.01)
  H01L 21/28      (2006.01)
(52) U.S. Cl.
  CPC .... H01L 21/28008 (2013.01); H01L 27/1248 (2013.01); H01L 29/24 (2013.01); H01L 29/78606 (2013.01)
(58) Field of Classification Search
  USPC .......................................... 349/42
  See application file for complete search history.

(56) References Cited

U.S. PATENT DOCUMENTS

| | | |
|---|---|---|
| 2005/0039670 A1 | 2/2005 | Hosono et al. |
| 2005/0051776 A1 | 3/2005 | Miyagi et al. |
| 2006/0113536 A1 | 6/2006 | Kumomi et al. |
| 2006/0192912 A1* | 8/2006 | Itou .................. G02F 1/133555 349/114 |
| 2007/0052025 A1 | 3/2007 | Yabuta |
| 2007/0182892 A1* | 8/2007 | Higa ................. G02F 1/133555 349/114 |
| 2008/0044982 A1* | 2/2008 | You .......................... H01L 27/12 438/443 |
| 2009/0103025 A1* | 4/2009 | Tanno ............... G02F 1/134363 349/110 |
| 2010/0032666 A1 | 2/2010 | Yamazaki et al. |
| 2011/0050551 A1 | 3/2011 | Ota et al. |
| 2011/0089424 A1* | 4/2011 | Hur ................... G02F 1/136213 257/59 |
| 2012/0007084 A1 | 1/2012 | Park et al. |
| 2012/0012851 A1 | 1/2012 | Yamazaki et al. |
| 2012/0176563 A1* | 7/2012 | Adachi ............. G02F 1/133536 349/62 |
| 2012/0242923 A1* | 9/2012 | Miyamoto ........ G02F 1/136227 349/43 |
| 2013/0181217 A1 | 7/2013 | Hara et al. |
| 2013/0188110 A1 | 7/2013 | Miyamoto |
| 2015/0255616 A1 | 9/2015 | Hara et al. |
| 2015/0279865 A1 | 10/2015 | Hara et al. |

FOREIGN PATENT DOCUMENTS

| | | |
|---|---|---|
| JP | 2003-86808 A | 3/2003 |
| JP | 2004-103957 A | 4/2004 |
| JP | 2006-165528 A | 6/2006 |
| JP | 2007-73705 A | 3/2007 |
| JP | 2011-53443 A | 3/2011 |
| WO | 2012/032749 A1 | 3/2012 |
| WO | 2012/046658 A1 | 4/2012 |
| WO | 2012/086513 A1 | 6/2012 |
| WO | 2014/054558 A1 | 4/2014 |
| WO | 2014/054563 A1 | 4/2014 |

* cited by examiner

SEMICONDUCTOR DEVICE AND DISPLAY DEVICE

TECHNICAL FIELD

The present invention relates to a semiconductor device and a display device.

BACKGROUND ART

Liquid crystal panels in liquid crystal display devices have a plurality of switching elements or thin-film transistors (hereinafter, TFTs) that are arranged in a matrix (rows and columns) in order to control the operation of respective pixels. Conventionally, silicon semiconductors such as amorphous silicon were generally used as semiconductor films for TFTs. However, the usage of oxide semiconductors having high electron mobility as semiconductor films has been proposed recently. Patent Documents 1 to 3 disclose liquid crystal display devices adopting TFTs using these types of oxide semiconductors as switching elements. The usage of oxide semiconductors having high electron mobility can provide improvements such as size reduction of the TFTs compared to conventional products and improvement in the aperture ratio of the liquid crystal panel.

RELATED ART DOCUMENT

Patent Documents

Patent Document 1: Japanese Patent Application Laid-Open Publication No. 2004-103957
Patent Document 2: Japanese Patent Application Laid-Open Publication No. 2006-165528
Patent Document 3: Japanese Patent Application Laid-Open Publication No. 2007-73705

Problems to be Solved by the Invention

The electrical characteristics of oxide semiconductors are susceptible to degradation when the oxide semiconductors come into contact with moisture. Therefore, there is a risk that the switching elements will not operate properly if moisture enters the TFTs using oxide semiconductors from outside, other films, and the like.

SUMMARY OF THE INVENTION

The object of the present invention is to provide a semiconductor device and a display device including the semiconductor device, in which the semiconductor device has a feature that suppresses foreign materials such as moisture from entering an oxide semiconductor film.

Means for Solving the Problems

A semiconductor device, having: a semiconductor film made of an oxide semiconductor film and having a channel region; a first inorganic insulating film formed on the semiconductor film so as to cover the channel region; a first organic insulating film formed on the first insulating film and having a portion overlapping the channel region; and a group of inorganic films, having: a first electrode made of an inorganic conductive film and formed on the first organic insulating film so as to have a portion overlapping the channel region, a second inorganic insulating film formed on the first electrode and having a portion overlapping the channel region; and a second electrode made of an inorganic conductive film and formed on the second inorganic insulating film so as to have a portion overlapping the channel region, the second electrode being electrically connected to the semiconductor film via an opening formed through the first inorganic insulating film, the first organic insulating film, the first electrode, and the second inorganic insulating film in a location that does not overlap the channel region, wherein the group of inorganic films and the first inorganic insulating film sandwiches the first organic insulating film.

In the semiconductor device, the semiconductor film formed of an oxide semiconductor film has a channel region, and the first inorganic insulating film is formed on the semiconductor film so as to cover the channel region. In addition, the first organic insulating film is formed on the first inorganic insulating film, and the group of inorganic films is formed so as to sandwich the first organic insulating film with the first inorganic insulating film. By having the group of inorganic films that sandwich the first organic insulating film with the first inorganic insulating film, foreign materials such as moisture are suppressed from moving towards the semiconductor film through the group of inorganic films. In addition, even if a small amount of foreign materials such as moisture are included in the first organic insulating film, the foreign materials will be trapped between the first inorganic insulating film and the group of inorganic films. As a result, foreign materials such as moisture are suppressed from entering the semiconductor film, and change (degradation) of the electrical characteristics of the semiconductor device will be suppressed.

A semiconductor device, having: a semiconductor film made of an oxide semiconductor film and having a channel region; a first inorganic insulating film formed on the semiconductor film so as to cover the channel region; a first organic insulating film formed on the first inorganic insulating film and having a portion overlapping the channel region; a first electrode made of an inorganic conductive film and formed on the first organic insulating film so as to have a portion overlapping the channel region, a second organic insulating film formed on the first electrode and having a portion overlapping the channel region; and a second electrode made of an inorganic conductive film and formed on the second organic insulating film so as to have a portion overlapping the channel region, the second electrode being electrically connected to the semiconductor film via an opening formed through the first inorganic insulating film, the first organic insulating film, the first electrode, and the second organic insulating film in a location that does not overlap the channel region.

In the semiconductor device, the semiconductor film formed of an oxide semiconductor film has a channel region, and the first inorganic insulating film is formed on the semiconductor film so as to cover the channel region. In addition, the first organic insulating film is formed having a portion overlapping the channel region on the first inorganic insulating film, and the first electrode made of an inorganic conductive film having a portion overlapping the channel region is formed on the first organic insulating film. Additionally, the second organic insulating film having a portion overlapping the channel region is formed on the first electrode, and the second electrode formed of an inorganic conductive film having a portion overlapping the channel region is formed on the second organic insulating film. In other words, the respective films formed on the semiconductor film are inorganic films and organic films that are alternately stacked in an order of inorganic film (first inorganic insulating film), organic film (first organic insulating film), inorganic film (first electrode), organic film (second organic insulating film), and inorganic film (second electrode). If inorganic films and organic films are alternately stacked in this manner, then, even if foreign materials such as a small amount of moisture are included in the first organic insulating film and the second organic insulating film, the foreign materials will be trapped by the respective inorganic films. In addition, even if foreign materials such as moisture from outside passes through the second electrode, the foreign materials will be captured or the like by the second organic insulating film. Compared to the inorganic insulating film, the second organic insulating film is hydrophilic. As a result, foreign materials such as moisture are suppressed from entering the semiconductor film, and change (degradation) of the electrical characteristics of the semiconductor device will be suppressed.

In the semiconductor device, it is preferable that the second organic insulating film be formed of a coating-type organic insulating material. The coating-type organic insulating material can planarize the surface of the film with ease and is especially preferable.

The semiconductor device may have: a substrate; a third electrode formed on the substrate; and a third electrode side insulating film formed on the substrate so as to cover the third electrode, wherein the semiconductor film is formed on the third electrode side insulating film.

The semiconductor device may have: a protective film disposed between the semiconductor film and the first inorganic insulating film so as to cover the channel region. The protective film is excellent for suppressing foreign materials such as moisture and the like from entering the channel region of the semiconductor device.

The semiconductor device may have: a pair of source and drain electrodes each having a contact portion in direct contact with a surface of the semiconductor film, the source and drain electrodes facing each other across the channel region wherein the protective film is formed so as to cover a portion of a surface of the semiconductor film that is not in contact with the source and drain electrodes. In the semiconductor device, the channel region of the semiconductor film is more reliably protected from moisture and the like, because the protective film covers a portion of the surface of the semiconductor film that is not in contact with the contact portion. In addition, the semiconductor film including the channel region can be protected from moisture and the like even when the source electrode and the drain electrode are being formed and the like.

The semiconductor film of the semiconductor device may be formed of an oxide including at least one element selected from a group having indium (In), gallium (Ga), aluminum (Al), copper (Cu), zinc (Zn), and tin (Sn). If the semiconductor film of the semiconductor device has the above-mentioned configuration, the electron mobility of the semiconductor film is high even if the semiconductor film is amorphous, and the ON resistance of the switching element can be increased.

The semiconductor film of the semiconductor device may be formed of indium gallium zinc oxide. If the semiconductor film of the semiconductor device is formed of indium gallium zinc oxide, then excellent characteristics of high mobility and low OFF current can be obtained.

The first organic insulating film of the semiconductor device may be formed of an acrylic resin. Acrylic resin easily acquires moisture, and thus has a risk of causing the semiconductor film to oxidize due to the moisture, but because the second organic insulating film sandwiched by the group of inorganic films and the inorganic film is provided, the moisture is suppressed from moving towards the first organic insulating film from outside or the like. As a result, even if the acrylic resin is used as the first organic insulating film, the electrical characteristics of the semiconductor film are suppressed from changing (degrading).

The protective film of the semiconductor device may be formed of silicon oxide. Compared to silicon nitride, organic insulating material, and the like, silicon oxide is a material that is less likely to oxidize or reduce the semiconductor film and can suppress the electrical characteristics of the semiconductor film from changing (degrading), for example.

It is preferable that the second inorganic insulating film of the semiconductor device be formed of silicon oxide.

In the semiconductor device, the semiconductor film may be formed on the third electrode side insulating film so as to overlap the third electrode.

In the semiconductor device, the second electrode of the semiconductor device may be electrically connected to the drain electrode.

In the semiconductor device, the third electrode side insulating film may have a multilayer structure having a bottom layer third electrode side insulating film formed of silicon nitride and a top layer third electrode side insulating film formed of silicon oxide disposed between the bottom layer third electrode side insulating film and the semiconductor film. Silicon oxide is a material that is less likely to oxidize or reduce the semiconductor film compared to silicon nitride, organic insulating material, and the like, for example. The electrical characteristics of the semiconductor film are suppressed from changing (degrading) by disposing the top layer third electrode side insulating film formed of silicon oxide between the bottom layer third electrode side insulating film and the semiconductor film.

A display device according to the present invention has: the semiconductor device; an opposite substrate facing the semiconductor device; and a liquid crystal layer disposed between the semiconductor device and the opposite substrate. If the display device has the configuration mentioned above, the electrical characteristics of the semiconductor film are suppressed from changing (degrading) and the display device has excellent operational reliability and the like.

Effects of the Invention

The object of the present invention is to provide a semiconductor device that suppresses foreign materials such as moisture from entering a semiconductor film formed of an oxide semiconductor, and a display device including the semiconductor device.

DETAILED DESCRIPTION OF EMBODIMENTS

Embodiment 1

Embodiment 1 of the present invention will be explained below with reference to FIGS. 1 to 4. In the present embodiment, a liquid crystal display device (an example of a display device) 10 and an array substrate (an example of a semiconductor device) 11b used in the liquid crystal display device 10 will be described. The drawings indicate an X axis, a Y axis, and a Z axis that are perpendicular to each other. In some cases, the top side of FIG. 1 is referred to as the front side and the bottom side of the same figure is referred to as the back side to describe the liquid crystal display device 10 and the like.

Figure 1:
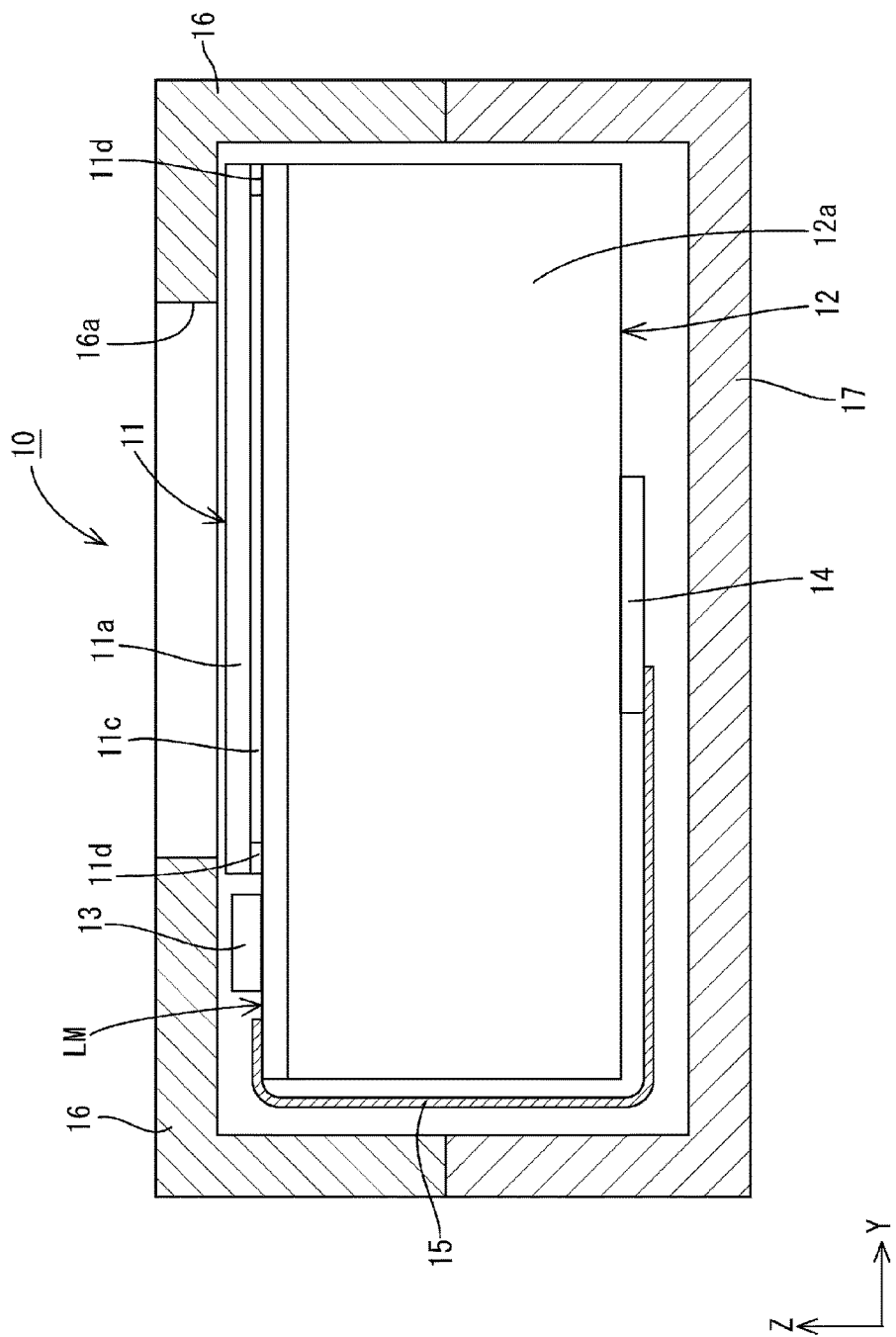
FIG. 1 is a cross-sectional view of a liquid crystal display device of Embodiment 1.

FIG. 1 is a cross-sectional view of the liquid crystal display device 10 according to Embodiment 1. As a whole, the liquid crystal display device 10 has an exterior shape that is a flat substantially cuboid shape. FIG. 1 shows a cross-sectional configuration of the liquid crystal display device 10 cut along the lengthwise direction and the thickness direction (front to back direction). As shown in FIG. 1, the liquid crystal display device 10 is mainly formed of a liquid crystal module LM and a backlight device (illumination device) 12.

Figure 2:
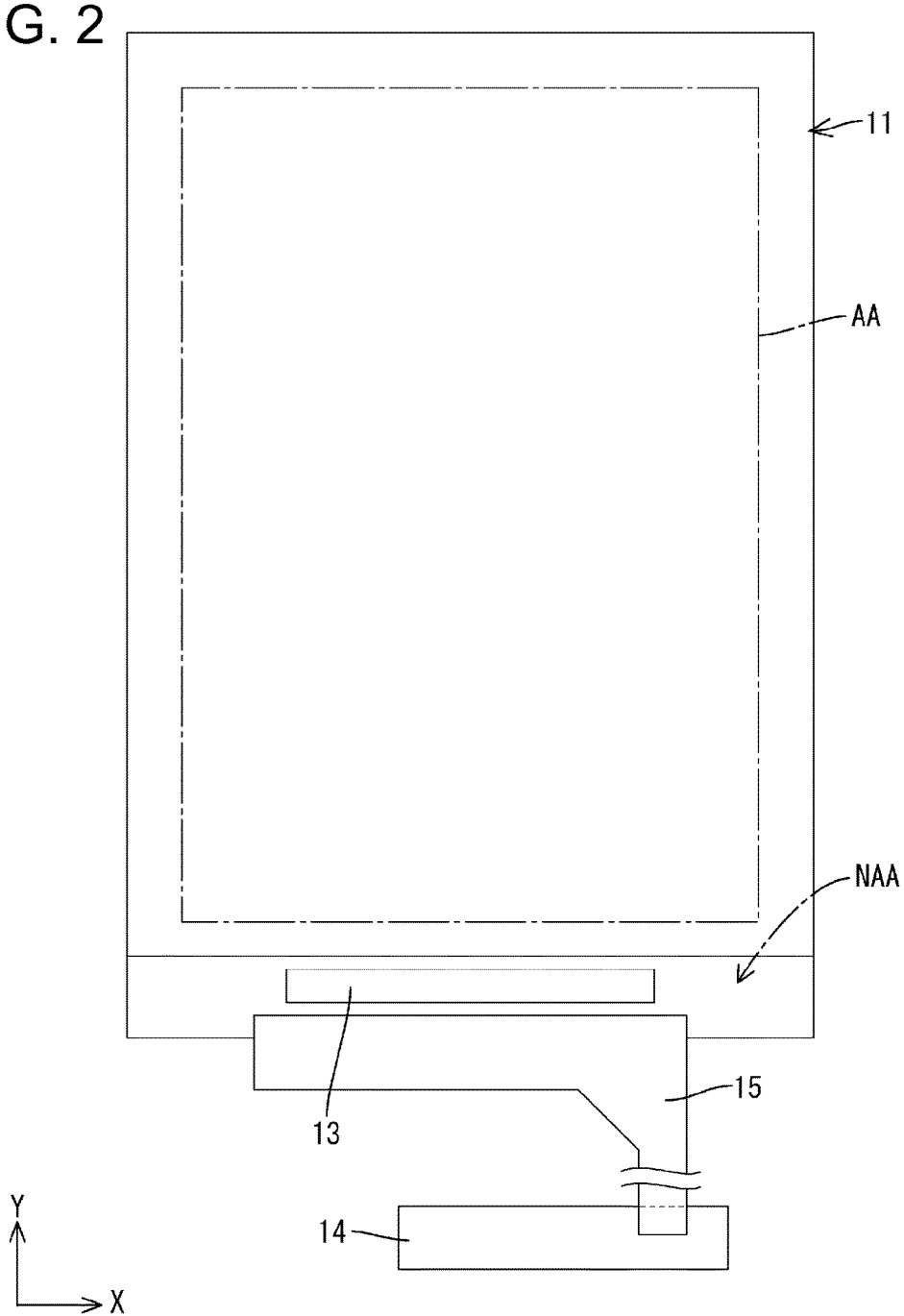
FIG. 2 is a plan view of a liquid crystal module that is provided in the liquid crystal display device.

FIG. 2 is a plan view of the liquid crystal module LM. As shown in FIG. 2, the liquid crystal module LM includes a liquid crystal panel (an example of a display panel) 11 having a display area AA that can perform image display and a frame shaped non-display area NAA around the periphery of the display area AA, a driver 13 that drives the liquid crystal panel 11, a control circuit substrate 14 that supplies various input signals from outside to the driver 13, and a flexible substrate 15 that electrically connects the liquid crystal panel 11 to the control circuit substrate 14.

As shown in FIG. 2, as a whole, the liquid crystal panel 11 has a vertically long rectangular shape, and the display area (active area) AA is disposed closer to one edge side (top side in FIG. 2) of the liquid crystal panel 11 in the lengthwise direction. In addition, the non-display area (non-active area) NAA that does not display images is disposed around the periphery of the display area AA. The driver 13 and the flexible substrate 15 are disposed on the other edge side (bottom side in FIG. 2) of the non-display portion NAA in the lengthwise direction. In addition, in FIG. 2 and the like, the short side direction (widthwise direction) of the liquid crystal panel 11 matches the X axis direction, and the long side direction (lengthwise direction) matches the Y axis direction. Details of the liquid crystal panel 11 will be mentioned later.

The backlight device 12 is a device for supplying light to the liquid crystal panel 11 of the liquid crystal module LM and is attached to the rear surface (back side) side of the liquid crystal module LM (liquid crystal panel 11). The backlight device 12 mainly includes a chassis 12a having a substantially box shape that has an opening towards the front side (liquid crystal panel 11 side), a light source (not shown) housed in the chassis 12a, and an optical sheet (not shown) that is provided so as to cover the opening of the chassis 12a and that emits planar light by transmitting light from the light source. An LED, a cold cathode fluorescent lamp, or the like is used as the light source, for example. In addition, the optical sheet adjusts the light emitted from the light source into a uniform and planar light.

The backlight device 12 and the liquid crystal panel 11 that are attached to each other are housed and held by a pair of front and back exterior members (case) 16 and 17. The front exterior member 16 has a substantially frame shape when seen in a plan view from the front side and an opening 16a is provided in the central portion thereof. The display area AA of the liquid crystal panel 11 is exposed through this opening 16a such that the display area AA is seen by the user.

The flexible substrate 15 has a resin base material formed of a synthetic resin material (polyimide resin or the like, for example) that is insulating and flexible, and has a plurality of wiring patterns (not shown) formed on the resin base material. The flexible substrate 15 has a belt-shape as a whole and a control circuit substrate 14 is connected to an edge portion thereof. Furthermore, an edge portion of the liquid crystal panel 11 is connected to another edge portion of the flexible substrate 15. The input signal supplied from the control circuit substrate 14 side is transmitted to the liquid crystal panel 11 side by the flexible substrate 15. The flexible substrate 15 is housed within the liquid crystal display device 10 in a bent state such that the cross-section of the flexible substrate 15 is in a substantially U shape.

The driver 13 is formed of an LSI chip having a driving circuit therein, and the driver 13 is activated based on a signal supplied from the control circuit substrate 14, which is a signal supplying source. If the driver 13 is activated in this manner, the driver 13 processes the input signal supplied by the control circuit substrate 14 and generates an output signal. Then, the output signal is outputted towards the liquid crystal panel 11. The driver 13 is directly mounted onto the non-display area NAA of the rear surface side substrate (array substrate 11b mentioned later) of the liquid crystal panel 11 using a so-called COG (chip on glass) method.

The liquid crystal display device 10 of the present embodiment is used in various electronic devices such as a mobile information device (including electronic books, PDAs, and the like), mobile telephones (including smart-phones), laptops (including tablet PCs and the like), digital photo frames, portable gaming devices, and electronic ink papers. The liquid crystal panel 11 used in the liquid crystal display device 10 of the present embodiment is usually categorized as small or medium small, and the screen size thereof ranges between several inches to several dozen inches.

The liquid crystal panel 11 will be described here in detail. As shown in FIG. 1 and the like, the liquid crystal panel 11 has a pair of substrates 11a and 11b and a liquid crystal layer 11c interposed between the two substrates 11a and 11b, and the liquid crystal layer 11c has liquid crystal molecules that change optical properties when an electric field is applied. The two substrates 11a and 11b are bonded to each other by a frame shaped sealing member 11d such that a gap (space) that can fit the liquid crystal layer 11c is sustained between the two substrates 11a and 11b. The liquid crystal layer 11c is sealed within the sealing member 11d while being sandwiched between the pair of substrates 11a and 11b. Of the pair of substrates 11a and 11b, the front side is the color filter (hereinafter, CF) substrate (opposite substrate) 11a, and the back side is the array substrate (active matrix substrate, an example of a semiconductor device) 11b. A plurality of pixels P are provided in a matrix (rows and columns) within the display area AA of the liquid crystal panel 11.

The operation mode of the liquid crystal panel 11 of the present embodiment is commonly known as the FFS (fringe field switching) mode, which is a lateral electric field mode in which a pair of electrodes are provided on one substrate 11b and an electric field is applied to the liquid crystal molecules in a direction parallel (horizontal) to the substrate surface. Therefore, the array substrate (an example of a semiconductor device) 11b of the present embodiment has a pair of electrodes (pixel electrode 19 and common electrode 30 mentioned later) formed thereon.

The CF substrate 11a and the array substrate 11b both have substantially transparent glass substrates with high light-transmissive characteristics, and are formed of various films that are stacked on the glass substrate in a prescribed pattern. As shown in FIG. 2, the length of the CF substrate 11a in the widthwise direction and the length of the array substrate 11b in the widthwise direction are configured to be substantially the same. On the other hand, the length of the CF substrate 11a in the lengthwise direction is configured to be shorter than the length of the array substrate 11b in the lengthwise direction. Furthermore, the CF substrate 11a and the array substrate 11b are bonded to each other such that respective edge portions (top side in FIG. 2) of both substrates in the lengthwise direction match. As a result, the edge portion of the array substrate 11b on the other side (bottom side in FIG. 2) in the lengthwise direction does not overlap the CF substrate 11a and is exposed to the outside. This exposed portion has the area (mounting region) for mounting the driver 13 and the flexible substrate 15.

In addition, alignment films (not shown) for aligning the liquid crystal molecules included in the liquid crystal layer 11c are respectively formed on the inner surface side of the two substrates 11a and 11b. Furthermore, polarizing plates (not shown) are bonded on the respective outer surfaces of the two substrates 11a and 11b.

The CF substrate 11a has respective colored portions (CF, not shown) of R (red), G (green), and B (blue) arranged in a matrix. The colored portions are respectively allotted to the pixels and overlap the respective pixel electrodes of the array substrate 11b (described later) in a plan view. Furthermore, the respective colored portions of the CF substrate 11a are separated by the grid shaped black matrix (not shown) having light-shielding characteristics. The black matrix overlaps the gate wiring lines and the source wiring lines on the array substrate 11b (mentioned later) in a plan view. The alignment film is formed on the respective colored portions and the black matrix. In addition, in the CF substrate 11a of the present embodiment, one display pixel (picture element) that is a display unit of the liquid crystal panel 11 is formed of a group of three colored portions: R (red), G (green), and B (blue).

Figure 3:
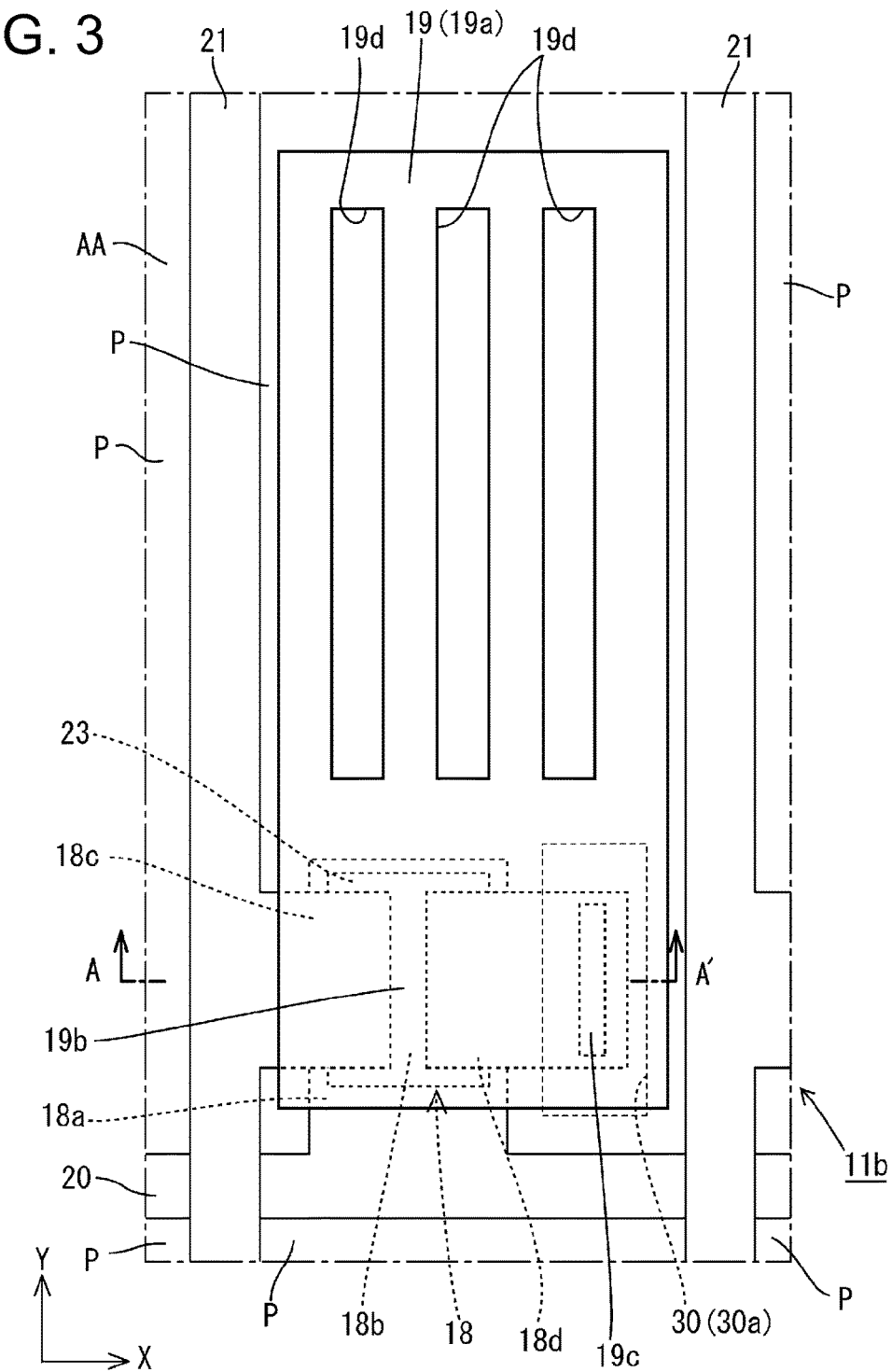
FIG. 3 is an expanded plan view of a pixel of an array substrate.
Figure 4:
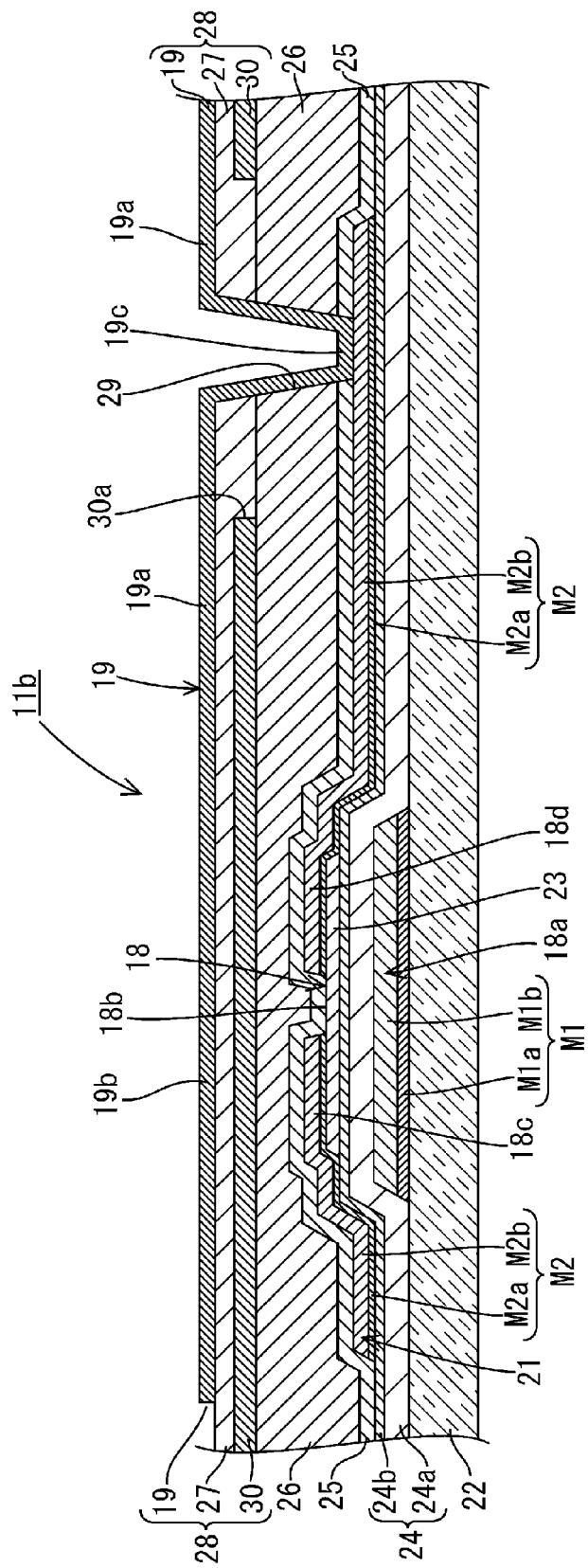
FIG. 4 is a cross-sectional view along a line A-A' of FIG. 3.

Next, with reference to FIGS. 3 and 4, a detailed description of the array substrate 11b will be provided. FIG. 3 is an expanded plan view of a pixel of the array substrate 11b, and FIG. 4 is a cross-sectional view along the line A-A' in FIG. 3. The respective structures provided inside the array substrate 11b (towards the liquid crystal layer 11c) are formed using known film forming techniques such as photolithography. As shown in FIG. 3, the display area AA of the array substrate 11b includes a plurality of TFTs (thin-film transistors) 18 and pixel electrodes 19 that are both arranged in a matrix. The TFTs 18 are used as switching elements. In addition, the peripheries of the TFTs 18 and the pixel electrodes 19 are surrounded by a plurality of gate wiring lines (scan lines) 20 and source wiring lines (signal lines) 21 that are disposed so as to intersect each other. In other words, the TFTs 18 and the pixel electrodes 19 are respectively assigned to intersections of the gate wiring lines (scan lines) 20 and the source wiring lines (signal lines) 21 that are arranged in a grid shape.

The TFT 18 has a gate electrode (third electrode) 18a that extends from the gate wiring line 20, a semiconductor film 23 having a channel region 18b, a source electrode 18c extending from the source wiring line 21, and a drain electrode 18d. The source electrode 18c and the drain electrode 18d are disposed on the semiconductor film 23 while sandwiching the channel region 18b such that the source electrode 18c and the drain electrode 18d face each other with a gap therebetween. The source electrode 18c and the drain electrode 18d are both electrically connected to the semiconductor film 23.

A substrate 22 is formed of a glass substrate, a silicon substrate, or an insulating substrate having heat resistance such as a plastic substrate. It is preferable that a transparent substrate such as a glass substrate that transmits light be used as the substrate 22 for the liquid crystal display device 10 of the present embodiment. A glass substrate is used as the substrate 22 in the present embodiment.

Gate wiring lines 20 formed of a first metal film M1, a gate electrode 18a, and the like are formed on the surface of the substrate 22 facing inward (liquid crystal layer 11c side). Furthermore, a gate insulating film (third electrode insulating film) 24 is formed on the substrate 22 such that the gate insulating film 24 covers the gate wiring lines 20 and the like formed of a first metal film M1. Furthermore, the semiconductor film 23 formed of an oxide semiconductor film, source wiring lines 21 formed of a second metal film M2, the source electrode 18c, the drain electrode 18d, and the like are formed on the gate insulating film 24. In addition, the first interlayer insulating film (first inorganic insulating film) 25 is formed on the gate insulating film 24 so as to cover the semiconductor film 23, the source wiring lines 21, and the like. Also, a resin insulating film (first organic insulating film) 26 is formed on the first interlayer insulating film 25 and the common electrode (first electrode) 30 made of a transparent inorganic conductive film is formed on the resin insulating film 26. Additionally, a second interlayer insulating film (second inorganic insulating film) 27 is formed so as to cover the common electrode 30, and a pixel electrode (second electrode) 19 made of a transparent inorganic conductive film is formed on the second interlayer insulating film 27. The first interlayer insulating film (first inorganic insulating film), the resin insulating film (first organic insulating film) 26, the common electrode (first electrode) 30, the second interlayer insulating film (second inorganic insulating film) 27, and the pixel electrode (second electrode) 19 are all provided on the array substrate 11b so as to cover the TFT 18 (in other words, include a portion covering the channel region 18b of the TFT 18).

The first metal film M1 is formed of a layered film of titanium (Ti) and copper (Cu). The first metal film M1 has a film M1a formed of titanium (Ti) disposed on the bottom layer side and a film M1b formed of copper (Cu) disposed on the top layer side. The first metal film M1 is formed on the substrate 22 by sputtering or the like. Then, the gate wiring line 20 formed of the first metal film M1 having a prescribed pattern, the gate electrode 18*a*, and the like are formed on the substrate 22 by performing photolithography and wet etching the copper (Cu) film M1*b*, and by also performing dry etching, removal and washing of the resist, and the like to the titanium (Ti) film M1*a*.

The gate insulating film (third electrode side insulating film) 24 is formed as a layered film having a bottom layer side gate insulating film 24*a* (bottom layer third electrode side insulating film) formed of silicon nitride (SiNx) and a top layer gate insulating film (top layer third electrode side insulating film) 24*b* formed of silicon oxide (SiOx, x=2, for example). The gate insulating film 24 is formed using the CVD method or the like as appropriate.

The semiconductor film 23 is formed of a film of indium gallium zinc oxide, which is a type of oxide semiconductor. The indium gallium zinc oxide film that forms the semiconductor film 23 is amorphous or crystalline, and especially if the film is crystalline, then the film has a crystalline structure known as a c-axis aligned crystal. The semiconductor film 23 forms the channel region 18*b* and the like of the TFTs 18. Meanwhile, the semiconductor film 23 is not only used for TFTs that are for display, but also for the TFTs that are not for display (not shown) and the like disposed in the non-display area NAA. The semiconductor film 23 is formed with a prescribed pattern on the gate insulating film 24 by forming the indium gallium zinc oxide film by sputtering and then performing photolithography, wet etching, resist removal and washing, and the like on the indium gallium zinc oxide film.

The second metal film M2 is formed of a layered film of titanium (Ti) and copper (Cu). The second metal film M2 has a configuration in which a film M2*a* formed of titanium (Ti) is disposed on the bottom layer side, and a film M2*b* formed of copper (Cu) is disposed on the top layer side. The second metal film M2 is formed on the gate insulating film 24 by sputtering or the like. In addition, the source wiring line 21 formed of the second metal film M2 having a prescribed pattern, the source electrode 18*c*, the drain electrode 18*d*, and the like are formed on the gate insulating film 24 by performing photolithography and wet etching to the copper (Cu) film M2*b* while performing dry etching, resist removal and washing, and the like to the titanium (Ti) film M2*a*. In addition, the channel region 18*b* of the semiconductor film 23 is exposed through the gap between the source electrode 18*c* and the drain electrode 18*d*.

The channel region 18*b* of the TFT 18 is mainly formed of a portion (region) of the semiconductor film 23 that is sandwiched between the source electrode 18*c* and the drain electrode 18*d*, and electrons can move between the source electrode 18*c* and the drain electrode 18*d*. As mentioned above, the semiconductor film 23 of the present embodiment is an indium gallium zinc oxide film and the electron mobility thereof, when compared to conventional amorphous silicon films and the like, is approximately twenty to fifty times higher. As a result, the TFTs 18 that use an indium gallium zinc oxide film (semiconductor film 23) can be reduced in size compared to conventional TFTs and the aperture ratio of the display region (pixel P) can be increased. The TFT 18 on the substrate 22 has the gate electrode 18*a* provided on the bottom layer, and the channel region 18*b* of the semiconductor film 23 stacked on the gate electrode 18*a* through the gate insulating film 24. In other words, the TFT 18 is a so-called inverse staggered type (bottom gate type).

An opening (contact hole) 29 that exposes a portion of the drain electrode 18*d* is formed in the first interlayer insulating film (first inorganic insulating film) 25, the resin insulating film (first organic insulating film) 26, and the second interlayer insulating film (second inorganic insulating film) 27. The opening 29 penetrates the first interlayer insulating film 25, the resin insulating film 26, and the second interlayer insulating film 27. Furthermore, the opening (contact hole) 29 is provided in a location that does not overlap the semiconductor film 23 and the channel region 18*b*.

The first interlayer insulating film (first inorganic insulating film) 25 is made of silicon oxide (SiOx, in which x=2, for example), and is formed by the plasma CVD method or the like so as to cover the source electrode 18*c*, the drain electrode 18*d*, the semiconductor film 23, and the like.

The resin insulating film (first organic insulating film) 26 is made of an acrylic resin material (polymethyl methacrylate (PMMA) or the like, for example) and functions as a planarizing film. It is preferable that the acrylic resin material be photosensitive. The resin insulating film (first organic insulating film) 26 is applied on the first interlayer insulating film 25 by spin coating, slit coating, or the like, for example.

In the present embodiment, a group of inorganic films 28 is formed of the common electrode (first electrode) 30 made of a transparent inorganic conductive film, a second interlayer insulating film (second inorganic insulating film) 27, and a pixel electrode (second electrode) 19 made of a transparent inorganic conductive film. The common electrode 30, the second interlayer insulating film 27, and the pixel electrode 19 are all formed of inorganic films having hydrophobic characteristics compared to organic films. As a result, the group of inorganic films 28 formed of these layers is also hydrophobic.

The common electrode (third electrode) 30 is formed of a transparent conductive film such as ITO (indium tin oxide) and ZnO (zinc oxide). The common electrode 30 is formed on the resin insulating film 26 so as to cover a plurality of pixels P such that the plurality of pixels P share the common electrode 30. The common electrode P is formed so as to substantially cover the entire area of the display area AA of the array substrate 11*b*. An opening 30*a* is provided in the common electrode 30 and inside the opening 30*a*, the first interlayer insulating film 25, the resin insulating film 26, and the second interlayer insulating film 27 are disposed so as to penetrate the opening (contact hole) 29. In other words, the opening 29 formed in the first interlayer insulating film (first inorganic insulating film) 25, resin insulating film (first organic insulating film) 26, and the second interlayer insulating film (second inorganic insulating film) 27, forms one opening with the opening 30*a* provided in the common electrode (first electrode) 30.

The second interlayer insulating film (second inorganic insulating film) 27 is made of a silicon nitride (SiNx) that is an inorganic insulating film, and is formed on the common electrode 30 using the plasma CVD method or the like so as to cover the channel region 18*b*.

The transparent inorganic conductive film used in the common electrode 30 are formed on the resin insulating film 26 (first organic insulating film) by sputtering, for example. Then, a common electrode 30 having a prescribed pattern is formed by performing photolithography, wet etching, resist removal and washing, and the like on the transparent inorganic conductive film. The common electrode (first electrode) 30 is sandwiched between the resin insulating film 26 (first organic insulating film) and the second interlayer insulating film (second inorganic insulating film) 27.

The pixel electrode (first electrode) 19 is formed of a transparent inorganic conductive film such as ITO (indium tin oxide) and ZnO (zinc oxide) in a similar manner to the common electrode 30. The pixel electrode 19 is disposed so as to fit in the rectangular region (pixel P) surrounded by the gate wiring lines 20 and the source wiring lines 21 when the array substrate 11b is seen in a plan view. Furthermore, the pixel electrode 19 is mainly formed on the second interlayer insulating film (second inorganic insulating film) 27. When seeing the array substrate 11b in a plan view, the pixel electrode 19 has a rectangular main body 19a covering the pixel P region, an overlapping portion 19b that overlaps the TFT 18, and a connecting portion 19c that connects with the drain electrode 18d through the opening (contact hole) 29. The pixel electrode 19 is electrically connected to the semiconductor film 23 of the TFT 18 by being connected to the drain electrode 18d through the opening 29 of the connecting portion 19c.

The main body 19a has a plurality of slits 19d extending with a narrow shape along the alignment direction (Y axis direction) of the source wiring lines 21. Three slits 19d are provided in the present embodiment. The slits 19d are arranged on the main body 19a at even intervals.

The overlapping portion 19b is a portion of the pixel electrode 19 and is formed of a transparent inorganic conductive film such as ITO. When the array substrate 11b is seen in a plan view, the TFT 18 is inside the overlapping portion 19b. Thus, in a plan view, the overlapping portion 19b overlaps the semiconductor film 23 (channel region 18b) of the TFT 18 such that the semiconductor film 23 is inside the overlapping portion 19b. In this manner, the overlapping portion 19b forms the group of inorganic films 28 with the second interlayer insulating film (second inorganic insulating film) 27 and the common electrode (first electrode) 30, in which the overlapping portion 19b overlaps the semiconductor film 23 of the TFT 18 in a plan view.

The pixel electrode 19 is formed by performing photolithography, wet etching, resist removal and washing, and the like on a transparent inorganic conductive film such as ITO formed by sputtering, for example.

The main body 19a and the overlapping portion 19b of the pixel electrode 19 face the common electrode 30 through the second interlayer insulating film 27. A common potential (reference potential) is applied to the common electrode 30 from a common wiring line (not shown). In addition, by controlling the potential applied to the pixel electrode 19 by the TFTs 18, a prescribed difference in potential is generated between the pixel electrode 19 and the common electrode 30.

If a prescribed difference in potential is generated between the pixel electrode 19 and the common electrode 30, then in the liquid crystal layer 11c between the array substrate 11b and the CF substrate 11a, the pixel electrode 19 having the slits 19d applies a fringe electric field (diagonal electric field) along a surface of the array substrate 11b and along a direction normal to the surface of the array substrate 11b. By controlling this electric field as appropriate, the alignment of the liquid crystal molecules within the liquid crystal layer 11c can be switched as appropriate.

The array substrate (semiconductor device) 11b used in the liquid crystal display device 10 of the present embodiment as described above, having: a semiconductor film 23 made of an oxide semiconductor film and having a channel region 18b; a first interlayer insulating film (first inorganic insulating film) 25 formed on the semiconductor film 23 so as to cover the channel region 18b; a resin insulating film (first organic insulating film) 26 formed on the first insulating film and having a portion overlapping the channel region 18b; and a group of inorganic films 28, having: a common electrode (first electrode) 30 made of an inorganic conductive film and formed on the resin insulating film (first organic insulating film) 26 so as to have a portion overlapping the channel region 18b, a second interlayer insulating film (second inorganic insulating film) 27 formed on the common electrode (first electrode) 30 and having a portion overlapping the channel region 18b; and a pixel electrode (second electrode) 19 made of an inorganic conductive film and formed on the second interlayer insulating film (second inorganic insulating film) 27 so as to have a portion overlapping the channel region 18b, the pixel electrode (second electrode) 19 being electrically connected to the semiconductor film via an opening formed through the first interlayer insulating film (first inorganic insulating film) 25, the resin insulating film (first organic insulating film) 26, the common electrode (first electrode) 30, and the second interlayer insulating film (second inorganic insulating film) 27 in a location that does not overlap the channel region 18b, wherein the group of inorganic films and the first interlayer insulating film (first inorganic insulating film) 25 sandwiches the resin insulating film (first organic insulating film) 25.

In this manner, by having the group of inorganic films 28 that sandwiches the resin insulating film (first organic insulating film) 26 with the first interlayer insulating film (first inorganic insulating film) 25, foreign materials such as moisture are suppressed from moving from outside (outer atmosphere and the liquid crystal layer 11c) through the group of inorganic films 28 towards the semiconductor film 23. In addition, even if a small amount of foreign materials such as moisture are included in the resin insulating film (first organic insulating film) 26, the foreign material will be trapped between the first interlayer insulating film (first inorganic insulating film) 25 and the group of inorganic films 28. As a result, foreign materials such as water are suppressed from entering the semiconductor film 23, and thus, the change (degradation) in the electrical characteristics of the array substrate (semiconductor device) 11b is suppressed.

Furthermore, the array substrate 11b of the present embodiment has the substrate 22, the gate electrode (third electrode) 18a formed on the substrate 22, and the gate insulating film (third electrode side insulating film) 24 formed so as to cover the gate electrode (third electrode) 18a, in which the semiconductor film 23 is formed on the gate insulating film (third electrode side insulating film) 24.

In addition, it is preferable that the semiconductor film 23 of the array substrate 11b of the present embodiment be formed of an oxide having at least one of an element in a group including indium (In), gallium (Ga), aluminum (Al), copper (Cu), zinc (Zn), and tin (Sn). If the semiconductor film 23 has this type of structure, even if the semiconductor film 23 is amorphous, the electron mobility is high, and the ON resistance of the switching element can be increased.

In addition, it is preferable that the semiconductor film 23 of the array substrate 11b in the present embodiment be formed of indium gallium zinc oxide. In particular, it is preferable that the semiconductor film 23 be an indium gallium zinc oxide film having the c-axis aligned crystal structure. If the semiconductor film 23 is formed of this type of indium gallium zinc oxide film, then excellent characteristics of high mobility and low OFF current can be obtained. The electrical characteristics of the semiconductor film 23 formed of an indium gallium zinc oxide and having the c-axis aligned crystal structure are particularly susceptible to changing (degrading) when foreign material such as moisture enters therein. As a result, if the array substrate 11b of the present embodiment has a group of inorganic films 28, the electrical characteristics of the semiconductor film 23 can, in particular, be effectively suppressed from degrading.

Also, the resin insulating film (first organic insulating film) 26 of the array substrate 11b of the present embodiment is formed of an acrylic resin. Acrylic resin easily acquires moisture, and thus has a risk of causing the semiconductor film to oxidize due to the moisture, but because the group of inorganic films 28 is provided, the moisture is suppressed from moving towards the resin insulating film (first organic insulating film) from outside or the like. As a result, even if acrylic resin is used as the resin insulating film (first organic insulating film) 26, the semiconductor film 23 is suppressed from changing (degrading).

In addition, the second interlayer insulating film (second inorganic insulating film) 27 of the array substrate 11b in the present embodiment is formed of silicon nitride.

In addition, the array substrate 11b of the present embodiment has a multilayer structure in which the gate insulating film (third electrode side insulating film) 24 has a bottom layer gate insulating film (bottom layer third electrode side insulating film) 24a formed of silicon nitride, and an upper gate insulating film (upper layer third electrode side insulating film) 24b formed of silicon oxide disposed between the bottom layer gate insulating film (bottom layer third electrode side insulating film) 24a and the semiconductor film 23. Silicon oxide is a material that is less likely to oxidize or reduce the semiconductor film 23 compared to silicon nitride, an organic insulating material, and the like, for example. By disposing this upper layer gate insulating film (upper layer third electrode side insulating film) 24b between the lower layer gate insulating film (lower layer third electrode side insulating film) 24a and the semiconductor film 23, the electrical characteristics of the semiconductor film 23 can be suppressed from changing (degrading).

In addition, the liquid crystal display device 10 according to the present embodiment includes the array substrate (semiconductor device) 11b, the CF substrate (opposite substrate) 11a disposed so as to face the array substrate (semiconductor device) 11b, and the liquid crystal layer 11c disposed between the array substrate (semiconductor device) 11b and the CF substrate (opposite substrate) 11a. If the liquid crystal display device 10 of the present embodiment has the above-mentioned configuration, then the electrical characteristics of the semiconductor film 23 are suppressed from changing (degrading) and the liquid crystal display device confers excellent operational reliability and the like.

Embodiment 2

Figure 5:
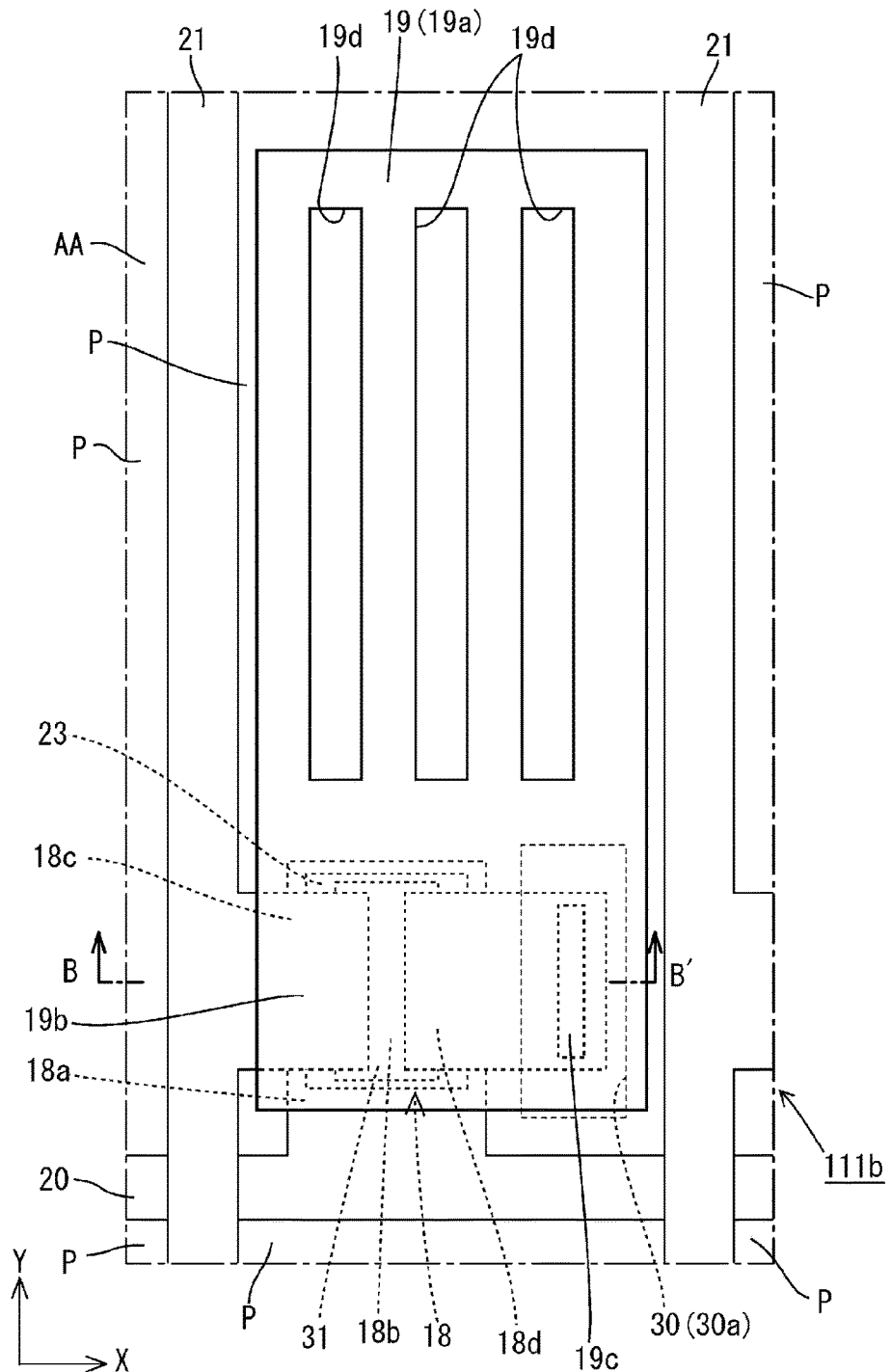
FIG. 5 is an expanded plan view of a pixel of an array substrate according to Embodiment 2.
Figure 6:
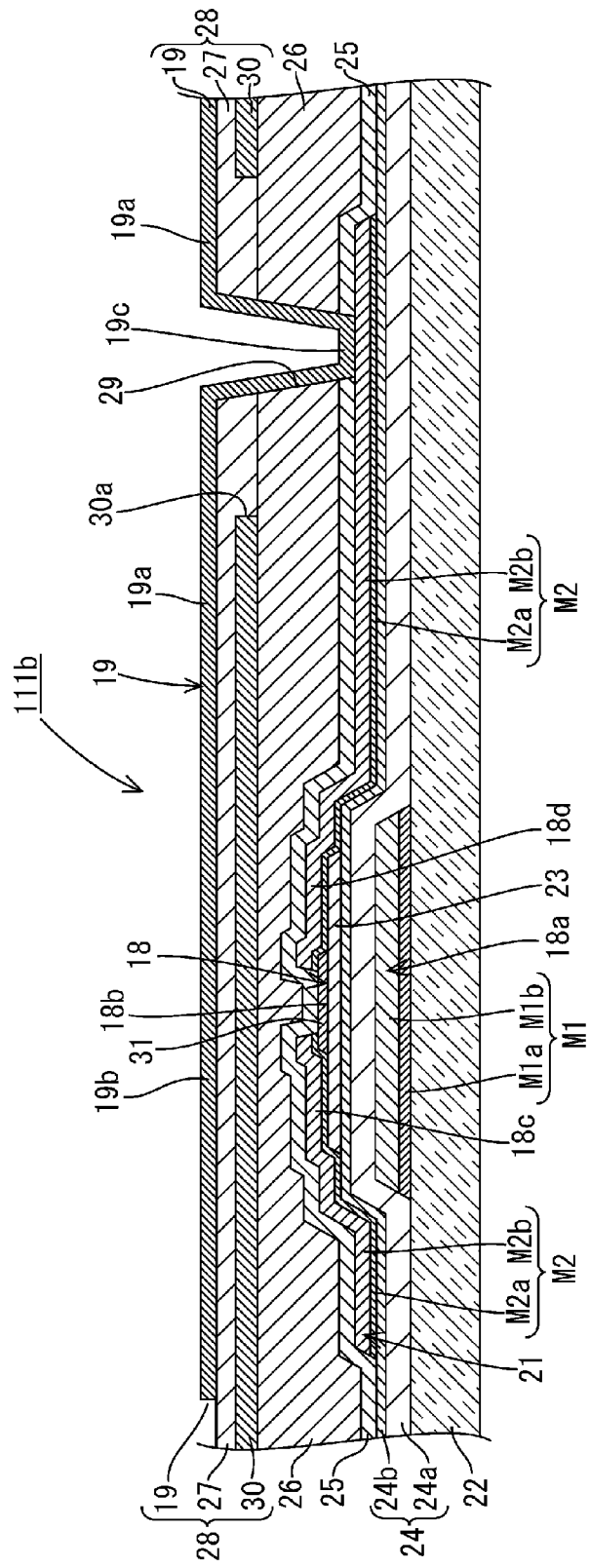
FIG. 6 is a cross-sectional view along a line B-B' of FIG. 5.

Next, Embodiment 2 of the present invention will be described using FIGS. 5 and 6. In the embodiments below, parts that are the same as those in Embodiment 1 are given the same reference characters as in Embodiment 1, and a detailed explanation thereof will be omitted. In the present embodiment, an array substrate 111b is described as an example of a semiconductor device. FIG. 5 is an expanded plan view of a pixel P of the array substrate 111b according to Embodiment 2, and FIG. 6 is a cross-sectional view of FIG. 5 along a line B-B'.

The basic structure of the array substrate 111B of the present embodiment is similar to the structure in Embodiment 1. However, the array substrate 111b of the present embodiment is different from Embodiment 1 in that the array substrate 111b has a protective film (etch stop film) 31 disposed between the semiconductor film 23 and the first interlayer insulating film (first inorganic insulating film) 25 so as to cover the channel region 18b. The protective film 31 of the present embodiment mainly protects the channel region 18b of the semiconductor film 23. In addition, an edge portion of the source electrode 18c disposed on the semiconductor film 23 is slightly riding up over the protective film 31. Furthermore, an edge portion of the drain electrode 18d disposed on the semiconductor film 23 is also slightly riding up over the protective film 31 in a similar manner.

The protective film 31 of the present embodiment is formed of silicon oxide (SiOx, in which x=2, for example). This protective film 31 is formed by performing photolithography, etching, resist removal and cleaning, and the like on the silicon oxide film formed by a plasma CVD method or the like. If the protective film 31 is formed on the array substrate 111b such that the protective film 31 covers the channel region 18b of the semiconductor film 23, then the channel region 18b is protected from foreign material such as moisture during the production of the array substrate 111b (in particular, during the processing of a second metal film M2 of the source electrode 18c and the like). In addition, after the array substrate 111b is manufactured, even when the array substrate 111b is mounted on the display device, if the protective film 31 is formed so as to cover the channel region 18b of the semiconductor film 23, then foreign materials such as moisture are suppressed from entering the channel region 18b of the semiconductor film 23 and the degradation of the semiconductor film 23 is suppressed.

Compared to silicon nitride, organic insulating material, and the like, silicon oxide is a material that is less likely to oxidize or reduce the semiconductor film 23, and can suppress the change (degradation) of the electrical characteristics of the semiconductor film 23.

In a similar manner to the array substrate 111b of the present embodiment, the degradation of the electrical characteristics of the semiconductor film 23 caused by foreign materials such as moisture entering can be further suppressed compared to Embodiment 1, if the group of inorganic films 28 overlaps the semiconductor film 23 in a plan view and the channel region 18b is protected by the protective film 31.

Embodiment 3

Figure 7:
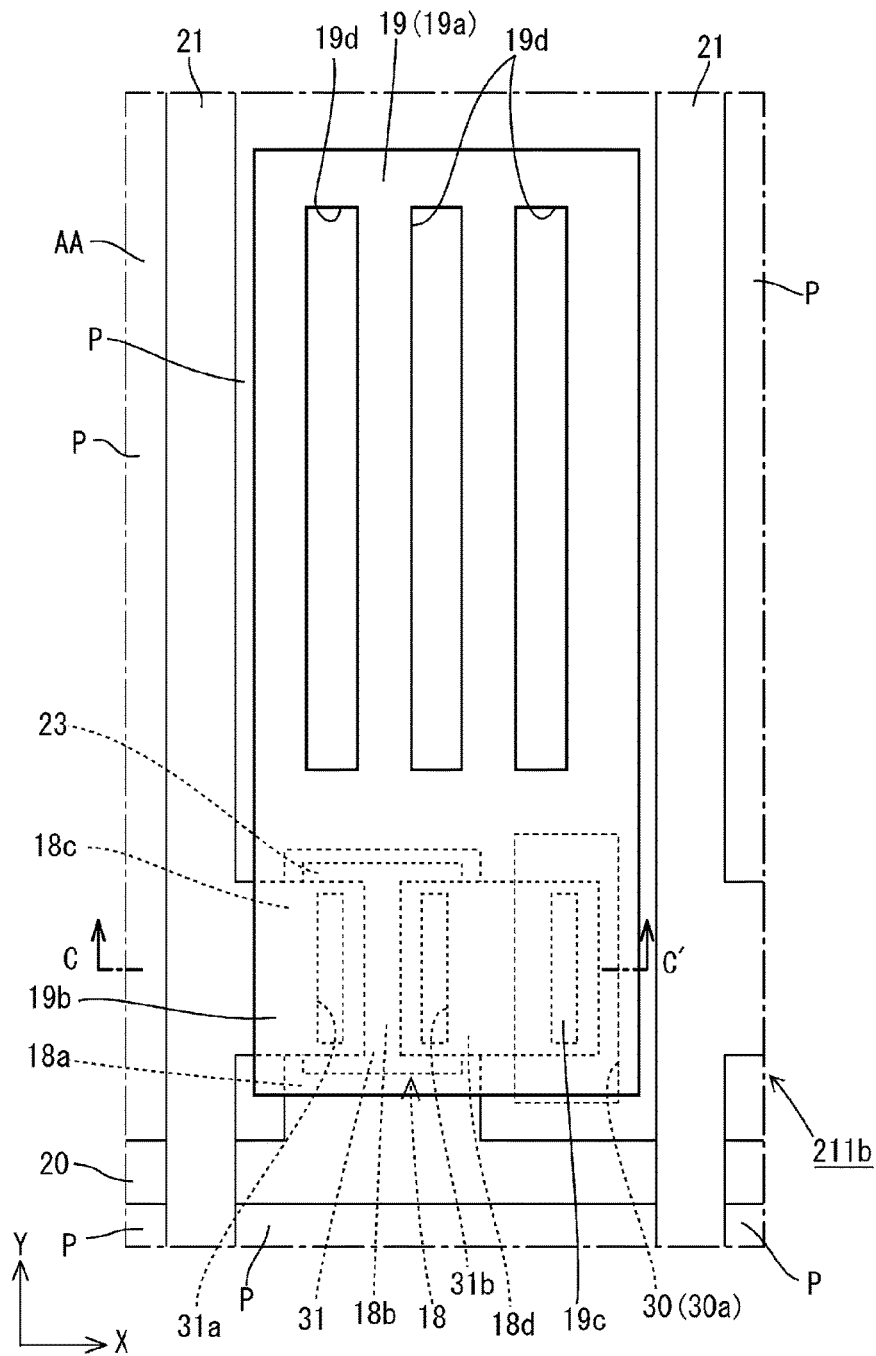
FIG. 7 is an expanded plan view of a pixel of an array substrate according to Embodiment 3.
Figure 8:
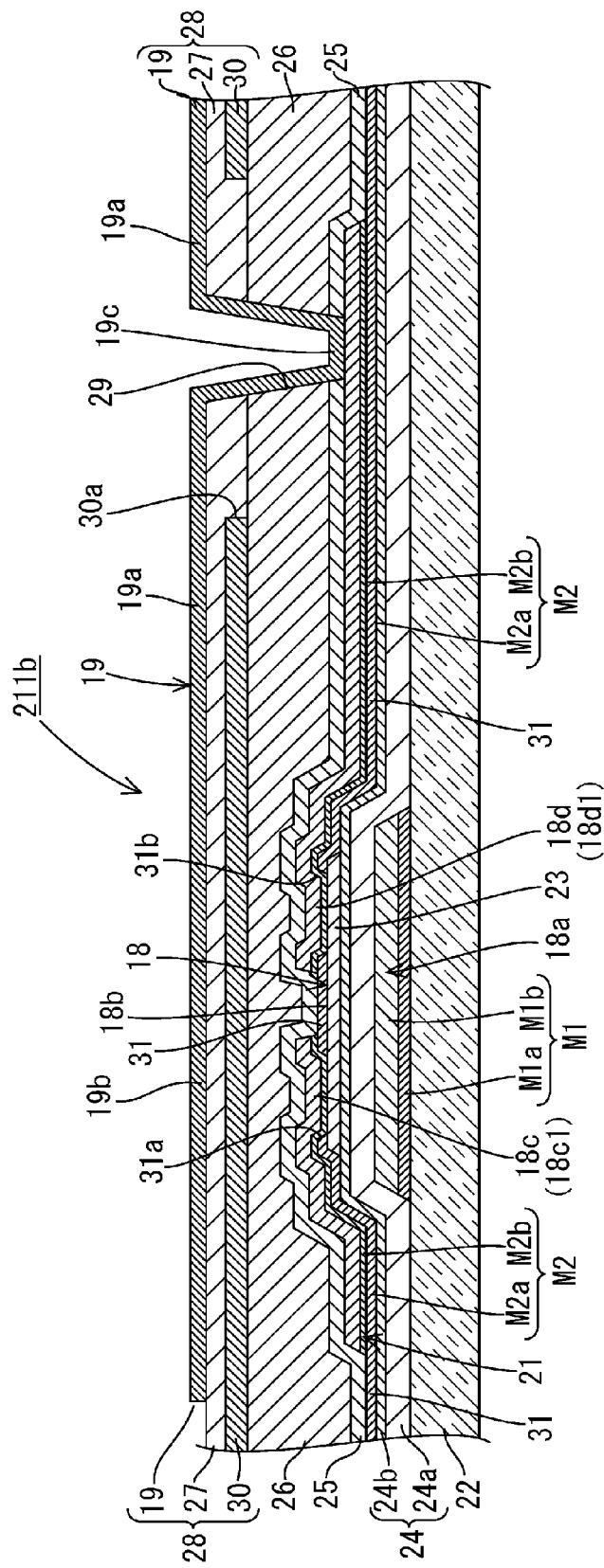
FIG. 8 is a cross-sectional view along a line C-C' of FIG. 7.

Next, Embodiment 3 of the present invention will be explained with reference to FIGS. 7 and 8. In the present embodiment, an array substrate 211b is described as an example of a semiconductor device. FIG. 7 is an expanded plan view of a pixel P of the array substrate 211b according to Embodiment 3, and FIG. 8 is a cross-sectional view of FIG. 7 along a line C-C'. The basic structure of the array substrate 211b of the present embodiment is similar to the structure in Embodiment 1. However, the array substrate 211b of the present embodiment is different from Embodiment 1 in that the array substrate 211b has a protective film (etch stop film) 31 disposed between the semiconductor film 23 and the first interlayer insulating film (first inorganic insulating film) 25 so as to cover substantially the entire semiconductor film 23. In other words, the array substrate 211b of the present embodiment has the protective film 31 formed on the semiconductor film 23, and in the case of the present embodiment, the area in which the protective film 31 is formed is configured to be wider than in Embodiment 2. In addition, the protective film 31 is also formed of silicon oxide (SiOx, in which x=2, for example) in a similar manner to Embodiment 2.

In the case of the present embodiment, the protective film 31 is provided with a portion in which the source electrode 18c is in contact with the semiconductor film 23, and the protective film 31 covers the remaining portion of the semiconductor film 23 that is not in contact with the drain electrode 18d. For convenience of explanation, the portion of the source electrode 18c that contacts the semiconductor film 23 is referred to as a contact portion 18c1, and the portion of the drain electrode 18d that contacts the semiconductor film 23 is referred to as a contact portion 18d1. The protective film 31 has an opening 31a to make the contact portion 18c1 contact the semiconductor film 23 and has an opening 31b to make the contact portion 18d1 contact the semiconductor film 23. In the case of the present embodiment, the protective film 31 is formed on the gate insulating film (third electrode side insulating film) 24 so as to cover the entire protective film (excluding openings 31a and 31b). In a similar manner to Embodiment 2, the protective film 31 of the present embodiment is also formed by performing photolithography, etching, resist removal and cleaning, and the like to the silicon oxide formed by the plasma CVD method or the like.

A source electrode 18c and a drain electrode 18d forms a pair on the array substrate 211b of the present embodiment such that the electrodes 18c and 18d face each other with the channel region 18b therebetween. The electrodes 18c and 18d respectively have the contact portion 18c1 and 18d1 that come into direct contact with the surface of the semiconductor film 23. In addition, the protective film 31 formed on the array substrate 211b so as to cover a portion of the surface of the semiconductor film 23 other than the portion in contact with the contact portion 18c1 and 18d1. In this manner, the protective film 31 more reliably protects the semiconductor film 23 (in particular, channel region 18b) from moisture and the like by covering the surface of the semiconductor film 31 that do not contact the contact portions 18c1 and 18d1. In addition, the semiconductor film 23 having the channel region 18b can be protected from moisture and the like even when the source electrode 18c and the drain electrode 18d are being formed.

By having the group of inorganic films 28 in a location that overlaps the semiconductor film 23 protected by the protective film 31, the electrical characteristics of the semiconductor film of the array substrate 211b of the present embodiment is suppressed from degrading caused by foreign materials such as moisture entering the semiconductor film 23 compared to Embodiment 1 and Embodiment 2.

Embodiment 4

Figure 9:
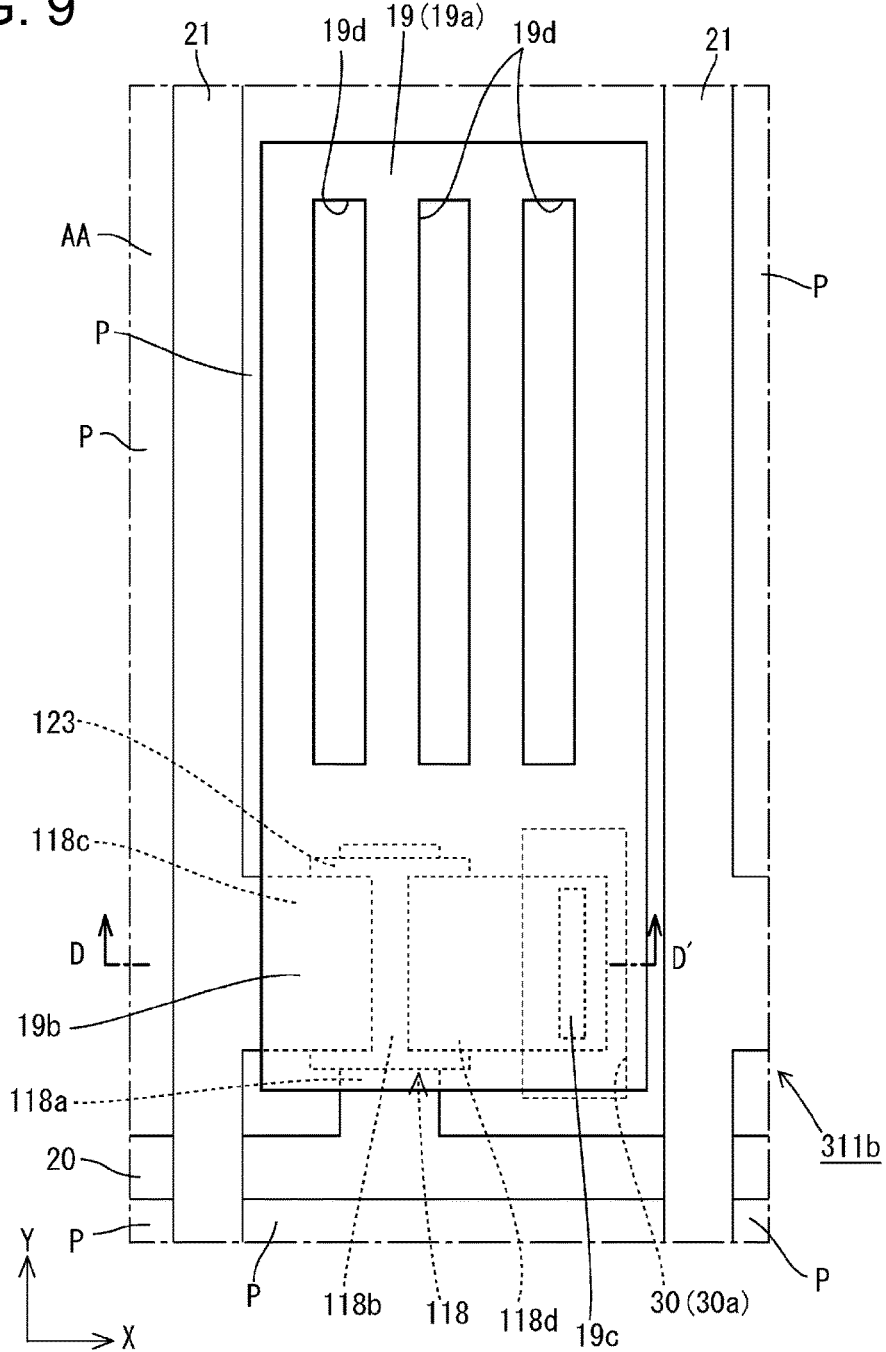
FIG. 9 is an expanded plan view of a pixel of an array substrate according to Embodiment 4.
Figure 10:
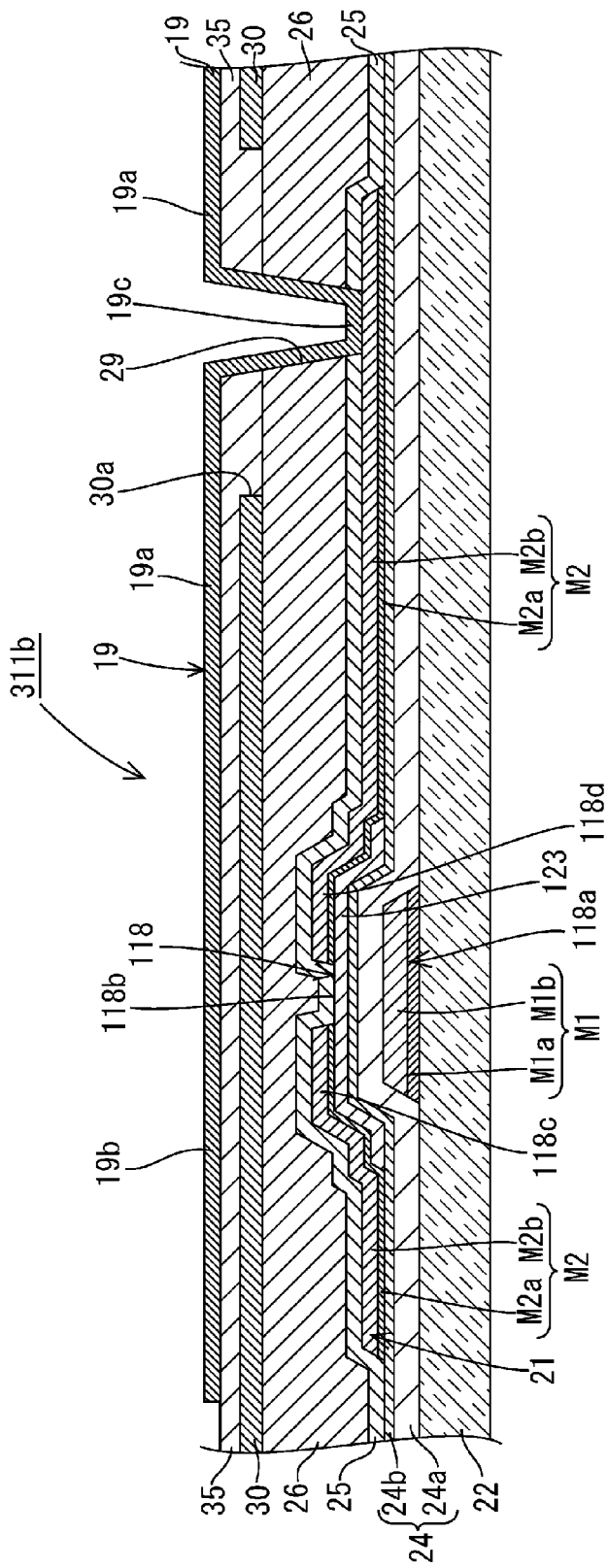
FIG. 10 is a cross-sectional view along a line D-D' of FIG. 9.

Next, Embodiment 4 of the present invention will be explained with reference to FIGS. 9 and 10. In the present embodiment, an array substrate 311b is described as an example of a semiconductor device. FIG. 9 is an expanded plan view of a pixel P of the array substrate 311b according to Embodiment 4, and FIG. 10 is a cross-sectional view of FIG. 7 along the line D-D'. The basic structure of the array substrate 311b of the present embodiment is similar to the structure in Embodiment 1. However, for the array substrate 311b of the present embodiment, the gate electrode 118a having TFTs 118 is configured to be narrower in the X axis direction (alignment direction of gate wiring line 20) than the gate electrode 18a of Embodiment 1. As a result, both edge portions of the semiconductor film 123 in the X axis direction (alignment direction of gate wiring line 20) overlaps the gate electrode 118a through a gate insulating film 24 while extending beyond the gate electrode 118a in a plan view. In addition, as shown in FIG. 10, the central portion of the semiconductor film 123 overlapping the gate electrode 118a is substantially flat, and a channel region 118b is formed on this flat portion. As shown in FIG. 10, both edge portions of the semiconductor film 123 disposed towards the outside of the flat portion respectively have slanted shapes. In addition, on this type of semiconductor film 123, a source electrode 118c and a drain electrode 118d are respectively disposed so as to face each other while sandwiching the channel region 118b.

The present embodiment is different from Embodiment 1 in that the second interlayer insulating film 35 is formed of an organic insulating film (second organic insulating film). A coating-type organic insulating material is used as the second interlayer insulating film (second organic insulating film) 35. The coating-type organic insulating material may be a SiO2 film for coating such as SOG materials. The coating-type organic insulating material can planarize the surface of the film with ease and is especially preferable.

The array substrate 311b of the present embodiment as mentioned above has: a semiconductor film 123 made of an oxide semiconductor film and having a channel region 118b; a first interlayer insulating film (first inorganic insulating film) 25 formed on the semiconductor film so as to cover the channel region 118b; a resin insulating film (first organic insulating film) 26 formed on the first interlayer insulating film (first inorganic insulating film) 25 and having a portion overlapping the channel region 118b; a common electrode (first electrode) 30 made of an inorganic conductive film and formed on the resin insulating film (first organic insulating film) 26 so as to have a portion overlapping the channel region 118b, a second interlayer insulating film (second organic insulating film) 35 formed on the common electrode (first electrode) 30 and having a portion overlapping the channel region; and a second electrode made of an inorganic conductive film and formed on the second organic insulating film so as to have a portion overlapping the channel region 118b, the pixel electrode (second electrode) 19 being electrically connected to the semiconductor film 123 via an opening 29, 30a formed through the first interlayer insulating film (first inorganic insulating film) 25, the resin insulating film (first organic insulating film) 26, the first electrode, and the second interlayer insulating film (second organic insulating film) 35 in a location that does not overlap the channel region 123.

In the array substrate 311b of the present embodiment, the respective films formed on the semiconductor film 123 are formed in the order of inorganic film (first interlayer insulating film (first inorganic insulating film) 25), organic film (resin insulating film (first organic insulating film) 26), inorganic film (common electrode (first electrode) 30), organic film (second interlayer insulating film (second organic insulating film) 35), inorganic film (pixel electrode (second electrode) 19) from the bottom layer (semiconductor film 123), and thus, inorganic films and organic films are alternately stacked on the semiconductor film 123. If the inorganic films and the organic films are alternately stacked in this manner, then, even if foreign materials such as a small amount of moisture are included in the first interlayer insulating film (first inorganic insulating film) 25 and the second interlayer insulating film (second organic insulating film) 35, the foreign material will be trapped between the respective inorganic films. Furthermore, even if foreign materials such as moisture passes through the pixel electrode (second electrode) 19, the foreign material will be captured or the like by the second interlayer insulating film (second organic insulating film) 35. The second interlayer insulating film (second organic insulating film) 35 is hydrophilic compared to an inorganic insulating film. As a result, foreign materials such as moisture are suppressed from entering the semiconductor film 123 and change (degradation) in the electrical characteristics of the semiconductor film 123 of the array substrate 311b can be suppressed.

In the present embodiment, as mentioned above, the respective films formed on the semiconductor film 123 are stacked such that inorganic films and organic films are alternately stacked starting from the bottom layer (semiconductor film 123) side, and thus, the common electrode 30, the second interlayer insulating film 27, and the pixel electrode 19 do not form the group of inorganic films 28 as in Embodiment 1.

Embodiment 5

Figure 11:
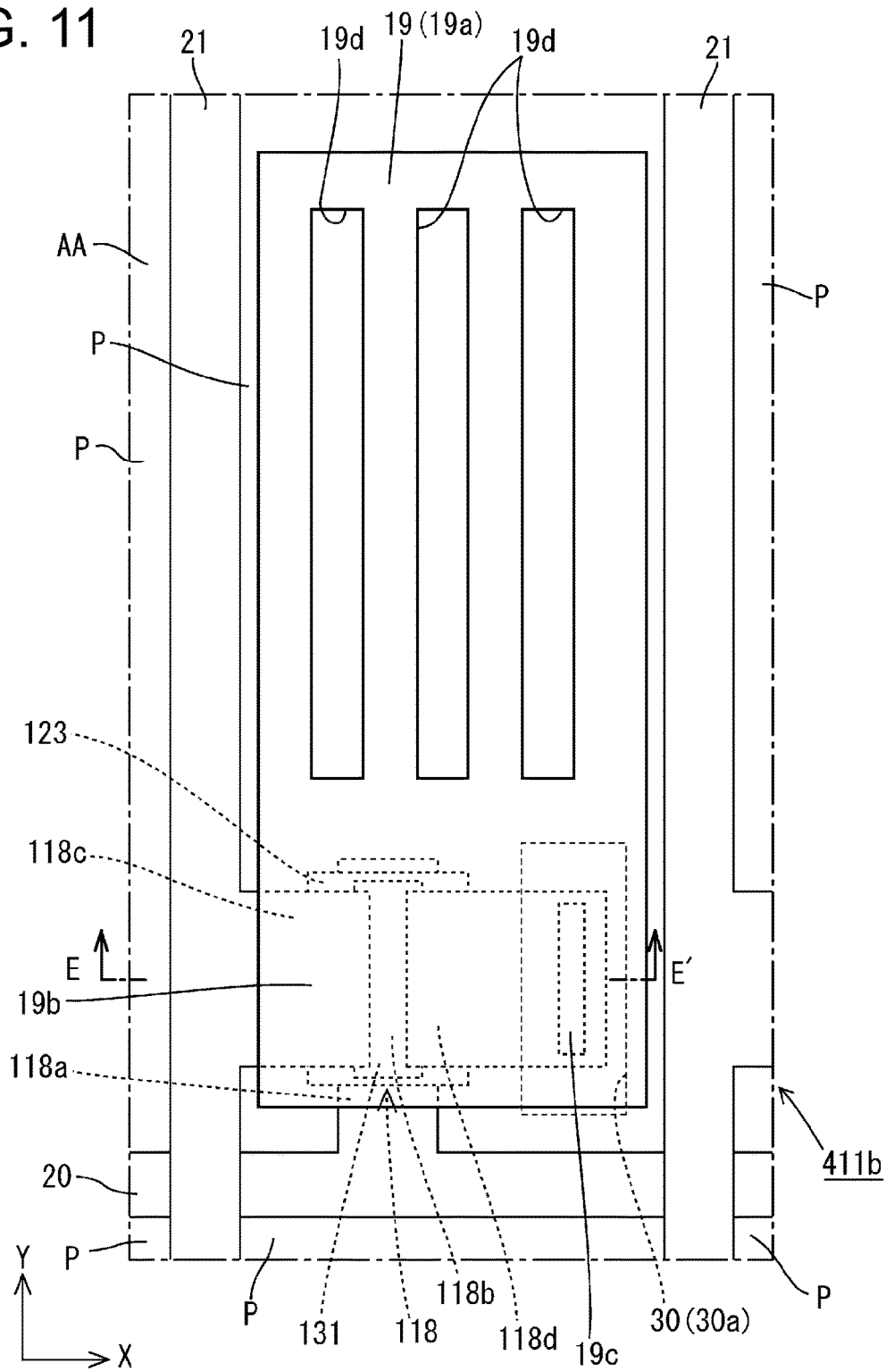
FIG. 11 is an expanded plan view of a pixel of an array substrate according to Embodiment 5.
Figure 12:
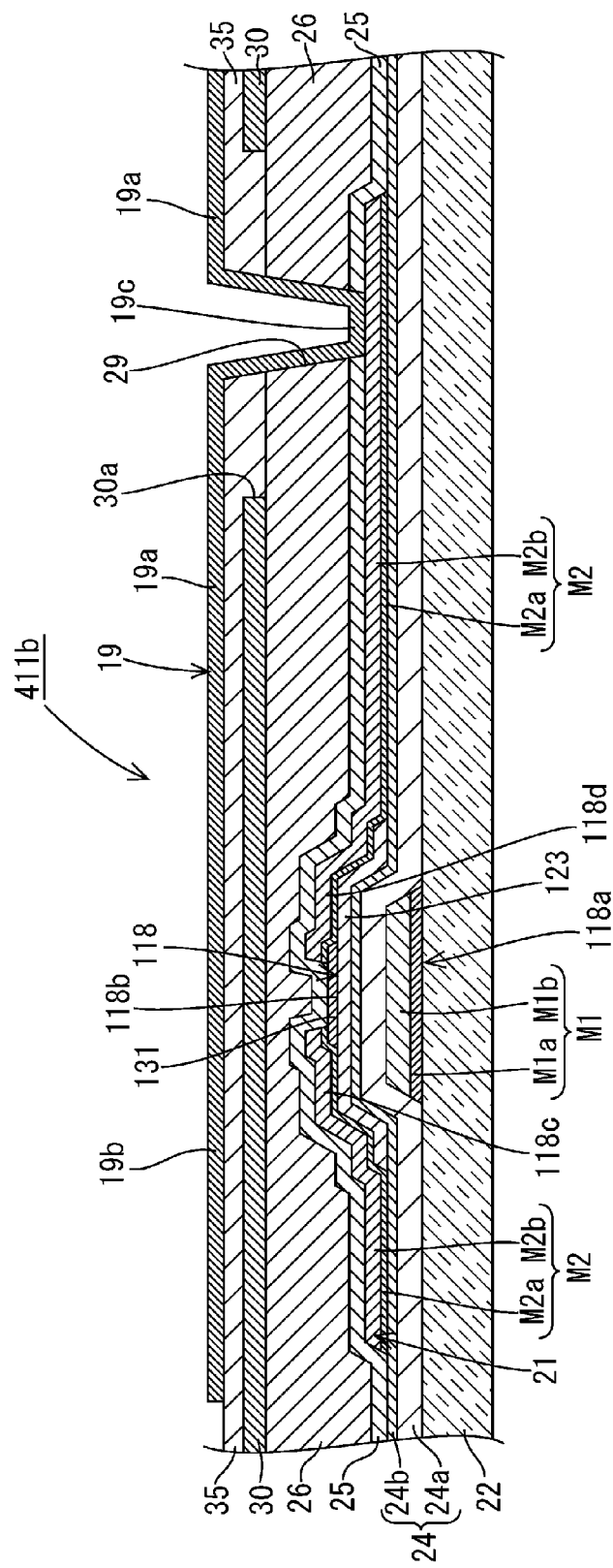
FIG. 12 is a cross-sectional view of FIG. 11 along a line E-E'.

Next, Embodiment 5 of the present invention will be explained below with reference to FIGS. 11 and 12. In the present embodiment, an array substrate 411b is described as an example of a semiconductor device. FIG. 11 is an expanded plan view of a pixel P of the array substrate 411b of Embodiment 5, and FIG. 12 is a cross-sectional figure along a line E-E' of FIG. 11. The basic structure of the array substrate 411b of the present embodiment is similar to that of Embodiment 4 and has a TFT 118 with a gate electrode 118a (width in the X axis direction) configured to have a narrow width. Furthermore, the second interlayer insulating film (second organic insulating film) 35 is formed of a coating-type organic insulating material (organic insulating film) in a similar manner to Embodiment 4.

However, the array substrate 411b of the present embodiment is different from Embodiment 4 and has a protective film 131 to protect the channel region 118b of the semiconductor film 123. This protective film 131 is formed of silicon oxide (SiOx, x=1, for example) in a similar manner to the protective film 31 of Embodiment 1. In other words, the array substrate 411b of the present embodiment has a configuration that is the same as the TFT 118 of Embodiment 4, except the protective film 131 is added to an area similar to Embodiment 2.

In a similar manner to Embodiment 4, the array substrate 411b of the present embodiment has respective films formed on the semiconductor film 123 such that inorganic films and organic films are alternately stacked starting from the bottom layer (semiconductor film 123) side. Furthermore, the channel region 118b of the semiconductor film 123 is protected by the protective film 131. As a result, compared to Embodiment 4, foreign materials such as moisture are further suppressed from entering the semiconductor film 123, and thus, the electrical characteristics of the semiconductor film 123 of the array substrate 411b is further suppressed from changing (degrading).

Embodiment 6

Figure 13:
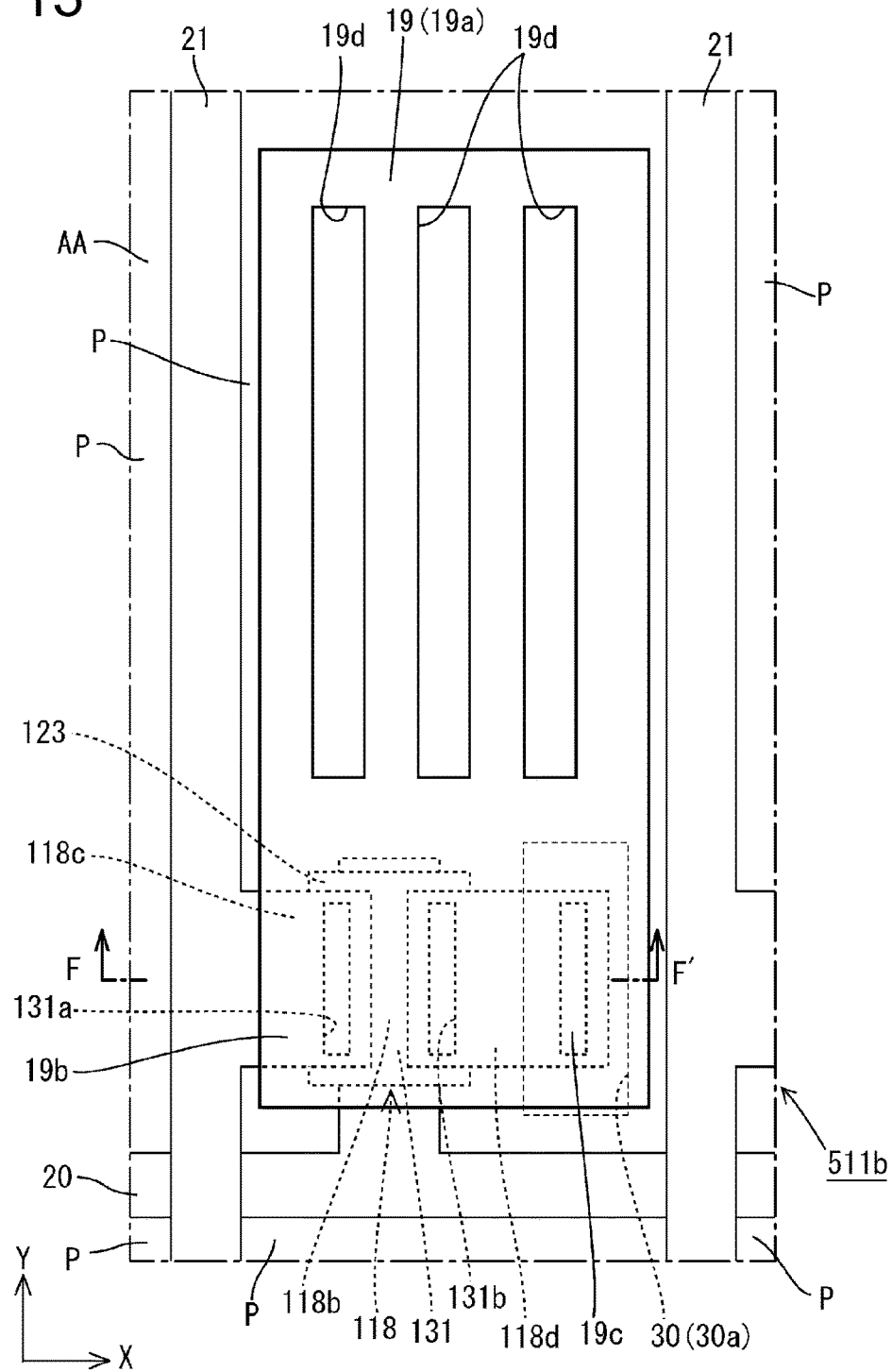
FIG. 13 is an expanded plan view of a pixel of an array substrate according to Embodiment 6.
Figure 14:
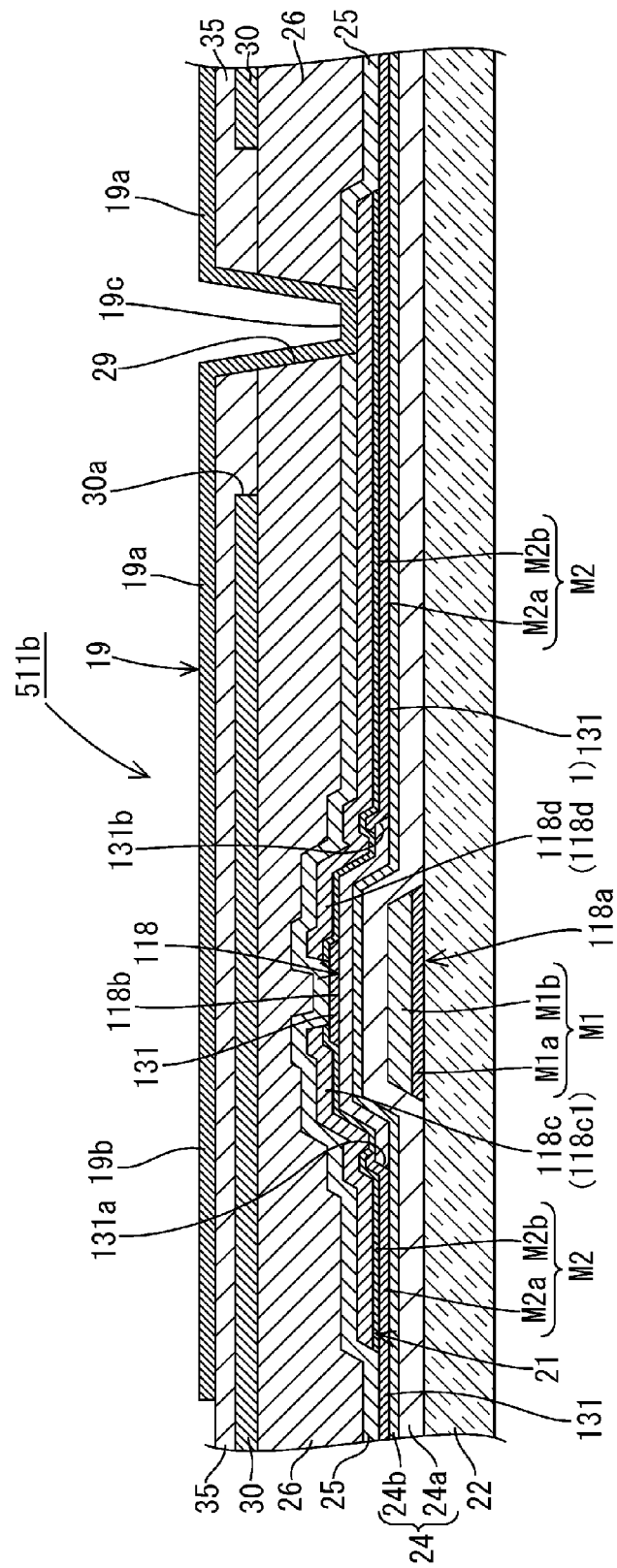
FIG. 14 is a cross-sectional view of FIG. 13 along a line F-F'.

Next, Embodiment 6 of the present invention will be explained below with reference to FIGS. 13 and 14. In the present embodiment, an array substrate 511b is described as an example of a semiconductor device. FIG. 13 is an expanded plan view of a pixel P of the array substrate 511b according to Embodiment 6, and FIG. 14 is a cross-sectional view along a line F-F' of FIG. 13. The basic structure of the array substrate 511b of the present embodiment is similar to that of Embodiment 4 and has a TFT 118 with a gate electrode 118a (width in the X axis direction) configured to have a narrow width. Furthermore, the second interlayer insulating film (second organic insulating film) 35 is formed of a coating-type organic insulating material (organic insulating film) in a similar manner to Embodiment 4.

However, the array substrate 511b of the present embodiment is different from Embodiment 4 in that the array substrate 511b has a protective film 131 disposed between a semiconductor film 123 and a first interlayer insulating film (first inorganic insulating film) 25 such that the protective film 131 covers substantially the entire surface of the semiconductor film 123. In other words, the array substrate 511b of Embodiment 6 has the protective film 131 formed on the semiconductor film 123 in a similar manner to Embodiment 3, but in the case of the present embodiment, the area in which the protective film 131 is formed is configured to be wider than in Embodiment 3. In other words, the array substrate 511b of the present embodiment has a configuration of the TFT 118 of Embodiment 4 with an addition of the protective film 131 in an area similar to that in Embodiment 3.

In the present embodiment, the protective film 131 is formed so as to cover a portion of the surface of the semiconductor film 123 that is not in contact with the source electrode 118c or the drain electrode 118d. For convenience of explanation, the portion of the source electrode 118c that contacts the semiconductor film 123 is referred to as a contact portion 118c1, and the portion of the drain electrode 118d that contacts the semiconductor film 123 is referred to as a contact portion 118d1. The protective film 131 has an opening 131a to make the contact portion 118c1 contact the semiconductor film 123 and has an opening 131b to make the contact portion 118d1 contact the semiconductor film 123. In the case of the present embodiment, the protective film 131 is formed so as to cover the entire gate insulating film (third electrode side insulating film) 24 (excluding portions other than openings 131a and 131b). In a similar manner to Embodiment 2 and the like, the protective film 131 of the present embodiment is also formed by performing photolithography, etching, resist removal and cleaning, and the like on the silicon oxide film formed by a plasma CVD method or the like.

In a similar manner to Embodiment 5, the array substrate 511b of the present embodiment has respective films formed on the semiconductor film 123 such that inorganic films and organic films are alternately stacked starting from the bottom layer (semiconductor film 123) side. Furthermore, the channel region 118b of the semiconductor film 123 is protected by the protective film 131 provided so as to entirely cover the gate insulating film (third electrode side insulating film) 24. As a result, compared to Embodiments 4 and 5, foreign materials such as moisture are further suppressed from entering the semiconductor film 123 and change (degradation) in the electrical characteristics of the semiconductor film 123 of the array substrate 511b is further suppressed.

In a similar manner to the array substrate 511b of the present embodiment, compared to Embodiments 4 and 5 sharing the same TFT 118 structure, the degradation of the electrical characteristics of the semiconductor film 123 due to foreign material such as moisture entering is further suppressed, because the overlapping portion 19b of the pixel electrode 19 is provided so as to overlap the semiconductor film 123 of the protective film 131 in a plan view.

Other Embodiments

The present invention is not limited to the embodiments shown in the drawings and described above, and the following embodiments are also included in the technical scope of the present invention, for example.

(1) In the respective embodiments above, an example of an array substrate for an FFS mode liquid crystal display device was shown, but in other embodiments, as long as the objective of the present invention is not hindered, an array substrate for a liquid crystal display device using other operation modes such as an IPS (in-plane switching) mode liquid crystal display device or a VA (vertical alignment) mode liquid crystal display device may be used.

(2) The structure of the array substrates in Embodiments 1 to 3 having the group of inorganic films may be applied to the array substrates having narrow gate electrodes as in Embodiments 4 to 6.

(3) The structure of the arrays substrates in Embodiments 4 to 6 and the like having the second organic insulating film (second interlayer insulating film) may be applied to array substrates in Embodiments 1 to 3 having wide gate electrodes.

(4) In the respective embodiments above, the first interlayer insulating film is formed of silicon oxide (SiOx), but in other embodiments, silicon nitride (SiNx), silicon oxynitride (SiNxOy, x>y), silicon oxynitride (SiOxNy, y>x), and the like may be used.

(5) In Embodiments 1 to 3 above, the second interlayer insulating film is formed of silicon nitride (SiNx), but in other embodiments, inorganic materials such as silicon oxide (SiOx), silicon oxynitride (SiNxOy, x>y), and silicon oxynitride (SiOxNy, y>x) may be used.

(6) In the respective embodiments above, the first metal film used for the gate wiring line, the gate electrode, and the like, and the second metal film used to form the source wiring line, the source electrode, the drain electrode, and the like were both layered structures having two layers (two types) of metal films, but in other embodiments, these metal films may be formed of one layer (one type), for example.

(7) In the respective embodiments above, the first metal film and the second metal film both have a bottom layer side that is a titanium (Ti) film, and a copper (Cu) film is formed on the titanium (Ti) film as the top layer side. In other embodiments, the bottom layer side may be formed of a metal film other than a titanium (Ti) film such as molybdenum (Mo), molybdenum nitride (MoN), titanium nitride (TiN), tungsten (W), niobium (Nb), tantalum (Ta), molybdenum titanium (MoTi), and molybdenum tungsten (MoW).

(8) In the respective embodiments above, the gate insulating film had a two layer structure, but in other embodiments, the gate insulating film may have one layer or more than two layers. In addition, the gate insulating film may be formed of materials other than silicon nitride (SiNx) and silicon oxide (SiOx) such as silicon nitride (SiNx), silicon oxynitride (SiNxOy, x>y), silicon oxynitride (SiOxNy, y>x), and the like.

(9) In the respective embodiments above, a capacitance wiring line was not provided on the array substrate, but in other embodiments, a capacitance wiring line may be provided as necessary.

(10) In the respective embodiments above, the opening (contact hole) for connecting the pixel electrode to the drain electrode was provided in a location that is relatively far from the TFT, but in other embodiments, the opening may be provided in a location closer to the TFT than in the respective embodiments above.

(11) In the respective embodiments above, a transparent inorganic conductive film such as ITO was used as a material of the pixel electrode, but in other embodiments (for reflective liquid crystal display devices, for example), a conductive film such as titanium, tungsten, nickel, gold, platinum, silver, aluminum, magnesium, calcium, lithium, and alloys of these may be used, for example. In the present specification, these conductive films are also included in the inorganic conductive film.

(12) In the respective embodiments mentioned above, an array substrate used as a semiconductor device of a liquid crystal panel was shown as an example, but in other embodiments, the semiconductor device may be used in an organic EL device, inorganic EL device, electrophoretic device, or the like.

DESCRIPTION OF REFERENCE CHARACTERS 10 liquid crystal display device (display device)
11 liquid crystal panel (display panel)
11a CF substrate
11b, 111b, 211b, 311b, 411b, 511b array substrate (semiconductor device)
11c liquid crystal layer
11d sealing member
12 backlight device (illumination device)
12a chassis
13 driver
14 control circuit substrate
15 flexible substrate
16, 17 exterior member
18,118 TFT (thin film transistor)
18a gate electrode (third electrode)
18b channel region
18c source electrode
18d drain electrode
19 pixel electrode (second electrode)
20 gate wiring line
21 source wiring line
22 substrate
23 semiconductor film
24 gate insulating film (third electrode side insulating layer)
25 first interlayer insulating film (first inorganic insulating film)
26 resin insulating film (first organic insulating film)
27 second interlayer insulating film (second inorganic insulating film)
28 group of inorganic films
29 opening (contact hole)
30 common electrode
31, 131 protective film
35 second interlayer insulating film (second inorganic insulating film)
LM liquid crystal module (display module)
M1 first metal film
M2 second metal film

What is claimed is:
1. A semiconductor device, comprising:
a semiconductor film made of an oxide semiconductor film and having a channel region;
a drain electrode attached to the semiconductor film at one side of the channel region, the drain electrode being extended in a first direction in a plan view;
a first inorganic insulating film formed on the semiconductor film so as to cover the channel region;
a first organic insulating film formed on the first insulating film and having a portion overlapping the channel region; and
a group of inorganic films, having:

a first electrode made of an inorganic conductive film and formed on the first organic insulating film so as to have a portion overlapping the channel region, a second inorganic insulating film formed on the first electrode and having a portion overlapping the channel region; and a second electrode made of an inorganic conductive film and formed on the second inorganic insulating film so as to have a portion overlapping the channel region, the second electrode being connected to the drain electrode via a contact hole that penetrates through the first inorganic insulating film, the first organic insulating film, and the second inorganic insulating film in a location that does not overlap the channel region, wherein the first electrode has a closed-patterned opening in the location that does not overlap the channel region, the closed-patterned opening entirely surrounding and containing therewithin said contact hole in the plan view so that all edges of the contact hole are entirely inside the closed-patterned opening of the first electrode in the plan view, wherein in the plan view, an edge of the closed-patterned opening of the first electrode traverses an entire width of the drain electrode in a direction that crosses the first direction, and an edge of the drain electrode opposite to the channel region is entirely inside the closed-patterned opening of the first electrode, and wherein the group of inorganic films and the first inorganic insulating film sandwiches the first organic insulating film.

2. The semiconductor device according to claim 1, further comprising:
a substrate;
a third electrode formed on the substrate; and
a third electrode side insulating film formed on the substrate so as to cover the third electrode,
wherein the semiconductor film is formed on the third electrode side insulating film.

3. The semiconductor device according to claim 2, wherein the semiconductor film is formed on the third electrode side insulating film so as to overlap the third electrode.

4. The semiconductor device according to claim 2, wherein the third electrode side insulating film has a multilayer structure having a bottom layer third electrode side insulating film formed of silicon nitride and a top layer third electrode side insulating film formed of silicon oxide disposed between the bottom layer third electrode side insulating film and the semiconductor film.

5. The semiconductor device according to claim 1, further comprising:
a protective film disposed between the semiconductor film and the first inorganic insulating film so as to cover the channel region,
wherein the protective film is formed of silicon oxide.

6. The semiconductor device according to claim 5, further comprising:
a source electrode in direct contact with a surface of the semiconductor film opposite to the drain electrode, said source and drain electrodes facing each other across the channel region therebelow,
wherein the protective film is formed so as to cover a portion of a surface of the semiconductor film that is not in contact with the source and drain electrodes.

7. The semiconductor device according to claim 1, wherein the semiconductor film is formed of an oxide including at least one element selected from a group comprising indium (In), gallium (Ga), aluminum (Al), copper (Cu), zinc (Zn), and tin (Sn).

8. The semiconductor device according to claim 1, wherein the semiconductor film is formed of indium gallium zinc oxide.

9. A display device, comprising: the semiconductor device according to claim 1, an opposite substrate facing the semiconductor device, and a liquid crystal layer disposed between the semiconductor device and the opposite substrate.

10. A semiconductor device, comprising:
a semiconductor film made of an oxide semiconductor film and having a channel region;
a drain electrode attached to the semiconductor film at one side of the channel region, the drain electrode being extended in a first direction in a plan view;
a first inorganic insulating film formed on the semiconductor film so as to cover the channel region;
a first organic insulating film formed on the first inorganic insulating film and having a portion overlapping the channel region;
a first electrode made of an inorganic conductive film and formed on the first organic insulating film so as to have a portion overlapping the channel region,
a second organic insulating film formed on the first electrode and having a portion overlapping the channel region; and
a second electrode made of an inorganic conductive film and formed on the second organic insulating film so as to have a portion overlapping the channel region, the second electrode being connected to the drain electrode via a contact hole that penetrates through the first inorganic insulating film, the first organic insulating film, and the second organic insulating film in a location that does not overlap the channel region,
wherein the first electrode has a closed-patterned opening in the location that does not overlap the channel region, the closed-patterned opening entirely surrounding and containing therewithin said contact hole in the plan view so that all edges of the contact hole are entirely inside the closed-patterned opening of the first electrode in the plan view, and
wherein in the plan view, an edge of the closed-patterned opening of the first electrode traverses an entire width of the drain electrode in a direction that crosses the first direction, and an edge of the drain electrode opposite to the channel region is entirely inside the closed-patterned opening of the first electrode.

11. The semiconductor device according to claim 10, wherein the second organic insulating film is formed of a coating-type organic insulating material.

12. The semiconductor device according to claim 10, further comprising:
a substrate;
a third electrode formed on the substrate; and
a third electrode side insulating film formed on the substrate so as to cover the third electrode,
wherein the semiconductor film is formed on the third electrode side insulating film.

13. The semiconductor device according to claim 10, further comprising:
a protective film disposed between the semiconductor film and the first inorganic insulating film so as to cover the channel region.

14. The semiconductor device according to claim 10, wherein the semiconductor film is formed of an oxide including at least one element selected from a group comprising indium (In), gallium (Ga), aluminum (Al), copper (Cu), zinc (Zn), and tin (Sn).

15. The semiconductor device according to claim 10, wherein the semiconductor film is formed of indium gallium zinc oxide.

16. A display device, comprising: the semiconductor device according to claim 10, an opposite substrate facing the semiconductor device, and a liquid crystal layer disposed between the semiconductor device and the opposite substrate.

17. A semiconductor device, comprising:
a semiconductor film made of an oxide semiconductor film and having a channel region;
a drain electrode attached to the semiconductor film at one side of the channel region;
a first inorganic insulating film formed on the semiconductor film so as to cover the channel region;
a first organic insulating film formed on the first insulating film and having a portion overlapping the channel region; and
a group of inorganic films, having:
   a first electrode made of an inorganic conductive film and formed on the first organic insulating film so as to have a portion overlapping the channel region,
   a second inorganic insulating film formed on the first electrode and having a portion overlapping the channel region; and
   a second electrode made of an inorganic conductive film and formed on the second inorganic insulating film so as to have a portion overlapping the channel region, the second electrode being connected to the drain electrode via a contact hole that penetrates through the first inorganic insulating film, the first organic insulating film, and the second inorganic insulating film in a location that does not overlap the channel region,
wherein the first electrode has a closed-patterned opening in the location that does not overlap the channel region, and
wherein the closed-patterned opening of the first electrode has a substantially rectangular shape and only one of sides of the closed-patterned opening overlaps the drain electrode in the plan view, and
wherein the group of inorganic films and the first inorganic insulating film sandwiches the first organic insulating film.

18. A display device, comprising: the semiconductor device according to claim 17, an opposite substrate facing the semiconductor device, and a liquid crystal layer disposed between the semiconductor device and the opposite substrate.

* * * * *